United States Patent
Ohno

(10) Patent No.: US 9,472,741 B2
(45) Date of Patent: Oct. 18, 2016

(54) SEMICONDUCTOR LIGHT-EMITTING DEVICE

(71) Applicant: PANASONIC CORPORATION, Osaka (JP)

(72) Inventor: Hiroshi Ohno, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 115 days.

(21) Appl. No.: 14/027,985

(22) Filed: Sep. 16, 2013

(65) Prior Publication Data

US 2014/0014998 A1 Jan. 16, 2014

Related U.S. Application Data

(63) Continuation of application No. PCT/JP2013/000686, filed on Feb. 7, 2013.

(30) Foreign Application Priority Data

Apr. 16, 2012 (JP) .................. 2012-092727

(51) Int. Cl.
*H01L 33/62* (2010.01)
*H01S 5/042* (2006.01)
(Continued)

(52) U.S. Cl.
CPC ............ *H01L 33/62* (2013.01); *B82Y 20/00* (2013.01); *H01S 5/0425* (2013.01);
(Continued)

(58) Field of Classification Search
CPC ..................................................... H01L 33/62
USPC ..................................................... 257/13, 15
See application file for complete search history.

(56) References Cited

U.S. PATENT DOCUMENTS 6,784,010 B2 * 8/2004 Yamaguchi ............ B82Y 20/00
438/39
6,990,132 B2 1/2006 Kneissl et al.
(Continued)

FOREIGN PATENT DOCUMENTS

EP 1 460 741 A1 9/2004
JP 09-074249 A 3/1997
(Continued)

OTHER PUBLICATIONS

International Search Report issued in PCT/JP2013/000686, dated Mar. 5, 2013.
(Continued)

*Primary Examiner* — Kenneth Parker
*Assistant Examiner* — Warren H Kilpatrick
(74) *Attorney, Agent, or Firm* — McDermott Will & Emery LLP

(57) ABSTRACT

A semiconductor light-emitting device includes a substrate; a first cladding layer formed on the substrate; a first guide layer formed on the first cladding layer; an active layer formed on the first guide layer; a second guide layer formed on the active layer; a contact layer formed on the second guide layer; a cladding electrode formed on the contact layer, and made of conductive metal oxide; and a pad electrode electrically coupled to the cladding electrode. The semiconductor light-emitting device includes a mesa structure including the contact layer. The cladding electrode has a greater width than the mesa structure. The cladding electrode covers an upper surface and side surfaces of the mesa structure, and is electrically coupled to the contact layer.

20 Claims, 23 Drawing Sheets

(51) Int. Cl.
   *B82Y 20/00*         (2011.01)
   *H01S 5/22*              (2006.01)
   *H01S 5/16*              (2006.01)
   *H01L 33/00*             (2010.01)
   *H01L 33/38*             (2010.01)
   *H01S 5/02*              (2006.01)
   *H01S 5/20*              (2006.01)
   *H01S 5/32*              (2006.01)
   *H01S 5/343*             (2006.01)

(52) U.S. Cl.
   CPC .......... *H01L 33/0045* (2013.01); *H01L 33/38* (2013.01); *H01L 2924/0002* (2013.01); *H01S 5/0202* (2013.01); *H01S 5/16* (2013.01); *H01S 5/2031* (2013.01); *H01S 5/22* (2013.01); *H01S 5/3216* (2013.01); *H01S 5/34333* (2013.01)

(56) References Cited

U.S. PATENT DOCUMENTS

| | | | |
|---|---|---|---|
| 7,485,897 B2 * | 2/2009 | Seong | ............... H01L 33/40 257/81 |
| 2004/0184497 A1 | 9/2004 | Kneissl et al. | |
| 2005/0279994 A1 | 12/2005 | Ueda et al. | |
| 2008/0008220 A1 | 1/2008 | Ueda et al. | |
| 2008/0181274 A1 * | 7/2008 | Michiue | ............... B82Y 20/00 372/44.011 |
| 2010/0025657 A1 * | 2/2010 | Nagahama | ............. B82Y 20/00 257/13 |
| 2010/0278207 A1 | 11/2010 | Sonobe et al. | |
| 2011/0235666 A1 | 9/2011 | Sonobe et al. | |
| 2012/0213242 A1 | 8/2012 | Tanaka et al. | |

FOREIGN PATENT DOCUMENTS

| | | |
|---|---|---|
| JP | 2004-289157 A | 10/2004 |
| JP | 2006-041491 A | 2/2006 |
| JP | 2007-184556 A | 7/2007 |
| JP | 2010-021271 A | 1/2010 |
| JP | 2011-138891 A | 7/2011 |
| WO | 2012-127778 A1 | 9/2012 |

OTHER PUBLICATIONS

Chinese First Office Action and Search Report issued in counterpart Chinese Patent Application No. 201380000426.0 on Feb. 6, 2015; 9 pages with English translation.

\* cited by examiner

SEMICONDUCTOR LIGHT-EMITTING DEVICE

CROSS-REFERENCE TO RELATED APPLICATIONS

This is a continuation of International Application No. PCT/JP2013/000686 filed on Feb. 7, 2013, which claims priority to Japanese Patent Application No. 2012-092727 filed on Apr. 16, 2012. The entire disclosures of these applications are incorporated by reference herein.

BACKGROUND

The present disclosure relates to semiconductor light-emitting devices such as semiconductor laser diodes (LDs) and superluminescent diodes (SLDs) outputting light in a visible spectrum ranging from blue/violet to red.

A conventional semiconductor light-emitting device shown in Japanese Patent Publication No. 2004-289157 will be described with reference to FIG. 22. FIG. 22 is a perspective view illustrating the structure of a conventional semiconductor light-emitting device (a laser diode structure 100).

As shown in FIG. 22, an n-type contact layer 110, an n-type lower cladding layer 130, an n-type lower waveguide layer 140, a multiple quantum well (MQW) region 150, a p-type confinement layer 160, and a p-type upper waveguide layer 170 are sequentially formed on a substrate 101 such as a sapphire substrate.

An upper cladding layer 180 is formed on the portion of the p-type upper waveguide layer 170, which is located above an active region 155 of the MQW region 150. Portions of an insulating layer 185 face each other with the upper cladding layer 180 interposed therebetween.

A p-type electrode 190 made of metal is formed on the upper cladding layer 180 and on the insulating layer 185. On the other hand, an n-type electrode 120 made of metal is formed on an exposed region of the n-type contact layer 110.

The upper cladding layer 180 is not made of semiconductor but a transparent electrode material (e.g., conductive metal oxide). Specifically, with use of indium tin oxide (ITO), the upper cladding layer 180 has both of the functions as the cladding layer and a p-type electrode.

This structure provides a laser diode performing single-mode operation with largely reduced series resistance, while maintaining a high optical confinement coefficient.

Other than Japanese Patent Publication No. 2004-289157, Japanese Patent Publication No. 2006-41491, and Japanese Patent Publication No. 2010-21271 also show a semiconductor light-emitting device using a transparent electrode material.

Japanese Patent Publication No. 2006-41491 teaches using a cladding layer electrode made of ITO. Japanese Patent Publication No. 2010-21271 teaches using an upper transparent electrode film made of ITO.

SUMMARY

After various studies, the present inventor found that the conventional semiconductor light-emitting devices have the following problem.

In the conventional semiconductor light-emitting devices, ITO having the most stable characteristics is used as the transparent electrode material. However, since the conventional semiconductor light-emitting devices do not have a mesa light waveguide structure, light is not sufficiently confined in a lateral direction, thereby causing an increase in the threshold current.

In view of the above-described problem, it is an objective of the present disclosure to provide a semiconductor light-emitting device reducing an increase in the threshold current.

A semiconductor light-emitting device according to the present disclosure includes a substrate; a first cladding layer formed on the substrate; a first guide layer formed on the first cladding layer; an active layer formed on the first guide layer; a second guide layer formed on the active layer; a contact layer formed on the second guide layer; a cladding electrode formed on the contact layer, and made of conductive metal oxide; and a pad electrode electrically coupled to the cladding electrode. The semiconductor light-emitting device includes a striped mesa structure including the contact layer. The cladding electrode has a greater width than the mesa structure. The cladding electrode covers an upper surface and side surfaces of the mesa structure, and is electrically coupled to the contact layer.

The present disclosure provides a highly efficient semiconductor light-emitting device reducing an increase in the threshold current.

BRIEF DESCRIPTION OF THE DRAWINGS

FIGS. 8A, 8B, and 8C are cross-sectional views illustrating the structures of part of semiconductor light-emitting devices according to a comparative example, the first embodiment, and the variation of the first embodiment, respectively.

DETAILED DESCRIPTION

Embodiments of the present disclosure will be described hereinafter with reference to the drawings. A first embodiment, a variation thereof, and second to sixth embodiments, which will be described below, are mere examples. The present disclosure is not limited to the following first embodiment, the variation, and the second to sixth embodiments.

First Embodiment

Figure 1:
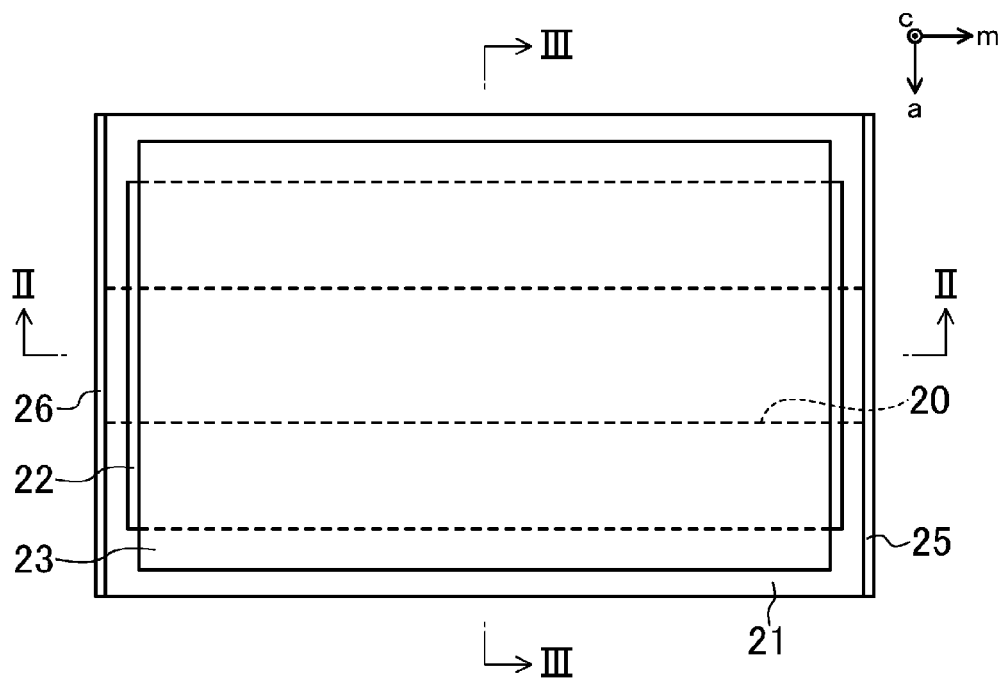
FIG. 1 is a top view illustrating the structure of a semiconductor light-emitting device according to a first embodiment, and more particularly is a top view seen from a pad electrode.
Figure 2:
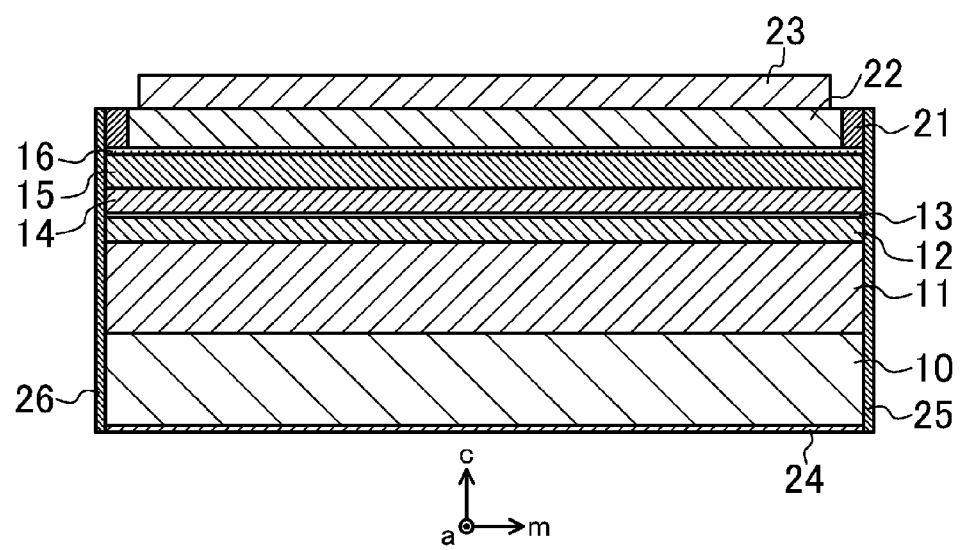
FIG. 2 is a cross-sectional view illustrating the structure of the semiconductor light-emitting device according to the first embodiment, and more particularly is a cross-sectional view taken along the line II-II of FIG. 1.
Figure 3:
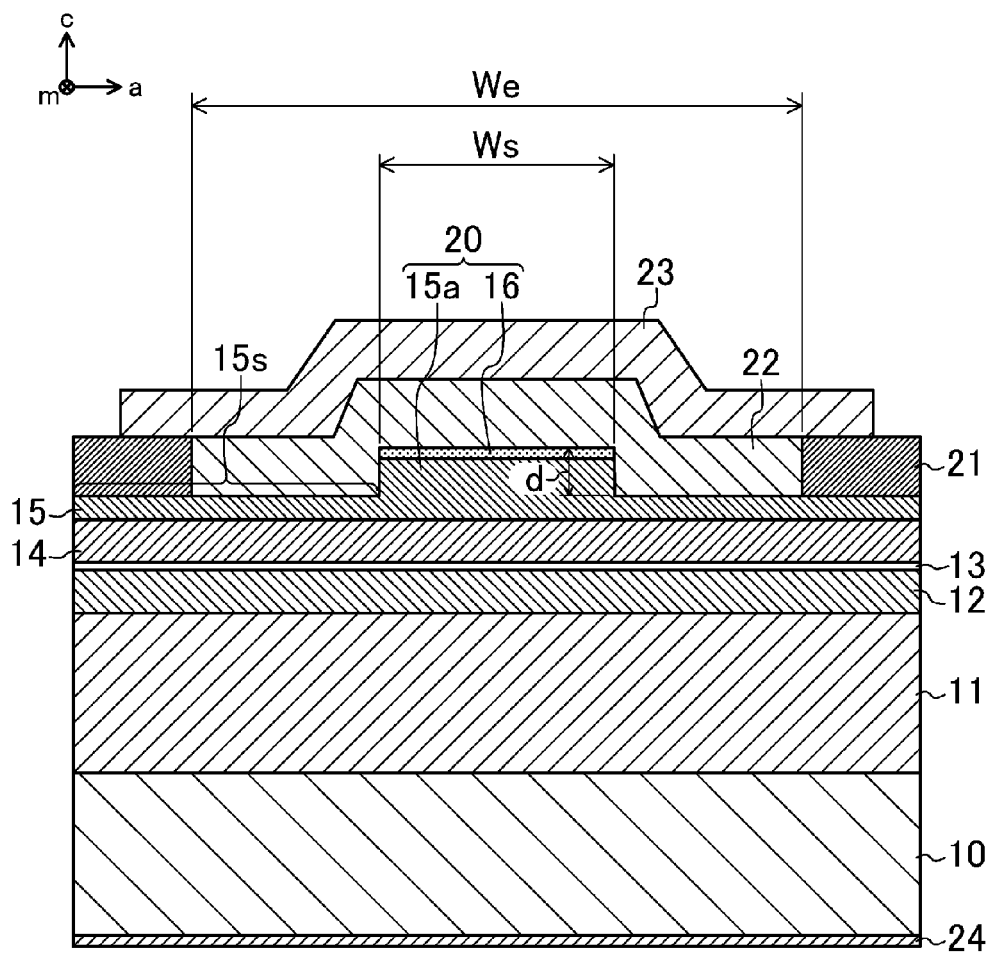
FIG. 3 is another cross-sectional view illustrating the structure of the semiconductor light-emitting device according to the first embodiment, more particularly is a cross-sectional view taken along the line III-III of FIG. 1.

A semiconductor light-emitting device according to the first embodiment of the present disclosure will be described below with reference to FIGS. 1-3. FIG. 1 is a top view illustrating the structure of the semiconductor light-emitting device according to this embodiment, and more particularly is a top view seen from a pad electrode. FIG. 2 is a cross-sectional view illustrating the structure of the semiconductor light-emitting device according to this embodiment, and more particularly is a cross-sectional view taken along the line II-II of FIG. 1. FIG. 3 is another cross-sectional view illustrating the structure of the semiconductor light-emitting device according to this embodiment, more particularly is a cross-sectional view taken along the line III-III of FIG. 1.

The semiconductor light-emitting device according to this embodiment includes a substrate 10, an n-type cladding layer (i.e., a first cladding layer) 11, an n-type guide layer (i.e., a first guide layer) 12, an active layer 13, a p-type guide layer (i.e., a second guide layer) 14, a contact layer 16, a cladding electrode 22, and a pad electrode 23.

The semiconductor light-emitting device according to this embodiment has a striped mesa structure 20 including at least the contact layer 16.

The n-type cladding layer 11 is formed on the substrate 10. The n-type guide layer 12 is formed on the n-type cladding layer 11. The active layer 13 is formed on the n-type guide layer 12. The p-type guide layer 14 is formed on the active layer 13. The contact layer 16 is formed on the p-type guide layer 14. The cladding electrode 22 is formed on the contact layer 16, and electrically coupled to the contact layer 16. The pad electrode 23 is formed on the cladding electrode 22, and electrically coupled to the cladding electrode 22. In this specification, being "formed on" a layer (or the substrate) means both of being formed on and in contact with the layer (or the substrate), and being formed on the layer (or the substrate) with another layer interposed therebetween.

The cladding electrode 22 is made of conductive metal oxide. The width We of the cladding electrode 22 is greater than the width Ws of the mesa structure 20. The cladding electrode 22 covers the upper surface and the side surfaces of the mesa structure 20.

This structure provides a highly efficient semiconductor light-emitting device reducing an increase in the threshold current. Specifically, as shown in FIG. 3, the width We of the cladding electrode 22 made of conductive metal oxide is greater than the width Ws of the mesa structure 20, thereby stably fabricating a highly symmetric optical confinement structure. As a result, a highly efficient semiconductor light-emitting device reducing an increase in the threshold current can be provided.

This advantage is more reliably obtained by forming the cladding electrode 22 with a thickness of 500 nm or more.

A more detailed structure of the semiconductor light-emitting device according to this embodiment will be described below.

The semiconductor light-emitting device according to this embodiment is a semiconductor laser, which outputs blue light with a wavelength ranging from about 400 nm to about 450 nm.

The semiconductor light-emitting device according to this embodiment further includes a p-type cladding layer (i.e., a second cladding layer) 15 formed between the p-type guide layer 14 and the contact layer 16. The p-type cladding layer 15 has a raised portion 15a.

The mesa structure 20 includes the raised portion 15a of the p-type cladding layer 15, and the contact layer 16 formed on the raised portion 15a. The distance d between the upper surface and the lower surface of the mesa structure 20 preferably ranges from 10 nm to 200 nm, both inclusive. The upper surface of the mesa structure 20 according to this embodiment is defined by the upper surface of the contact layer 16. The lower surface of the mesa structure 20 is defined by the upper surface of the region of the p-type cladding layer (i.e., the second cladding layer) 15 without the raised portion 15a.

The semiconductor light-emitting device according to this embodiment has a semiconductor multilayer formed by sequentially stacking an n-type buffer layer (not shown), the n-type cladding layer 11, the n-type guide layer 12, the active layer 13, the p-type guide layer 14, the p-type cladding layer 15, and a p-type contact layer 16 on a n-type substrate 10.

The n-type substrate 10 is an example substrate, the n-type cladding layer 11 is an example first cladding layer, the n-type guide layer 12 is an example first guide layer, the p-type guide layer 14 is an example second guide layer, the p-type cladding layer 15 is an example second cladding layer, and the p-type contact layer 16 is an example contact layer.

While the buffer layer may not be necessarily formed, the formation of the buffer layer improves the crystallinity of the semiconductor multilayer. Each of the layers forming the semiconductor multilayer is not necessarily a single layer having a single composition, but may be a multilayer having different compositions.

The cladding electrode 22 may be made of, for example, ITO, and functions as the cladding layer and a p-type electrode. The lateral optical confinement is represented by the difference in the refractive index between the mesa structure 20 and the cladding electrode 22.

The ITO cladding electrode 22 is an example cladding electrode. The cladding electrode 22 is made of a conductive material transparent to light emitted from the active layer 13. The term "transparent" means that the light emitted from the active layer 13 is little absorbed. The material may be, for example, conductive metal oxide. ITO is example conductive metal oxide, which may be, for example, ZnO, Al-doped ZnO (AZO), Ga-doped ZnO (GZO), In-doped ZnO (IZO), F-doped $SnO_2$ (FTO), Sb-doped $SnO_2$ (ATO), etc.

The cladding electrode 22 is formed not only on the contact layer 16 but also on the p-type cladding layer 15. The cladding electrode 22 covers not only the upper surface and the side surfaces of the mesa structure 20, but also the upper surfaces of the side portions of the p-type cladding layer 15 located at the sides of the mesa structure 20.

The cladding electrode 22 is in ohmic contact with the mesa structure 20. On the other hand, the cladding electrode 22 is in Schottky contact with the side portion of the p-type cladding layer 15 located at each side of the mesa structure 20 (see a high-resistive surface 15s in FIG. 3). Thus, a current actually flows to the mesa structure 20 only. This structure provides a highly efficient semiconductor light-emitting device with a reduced operating voltage.

The pad electrode 23 contains gold (Au). The Au-containing pad electrode 23 is an example pad electrode. The pad electrode 23 may be made of, for example, titanium (Ti)/platinum (Pt)/gold (Au). The expression "Ti/Pt/Au" means that a Ti layer, a Pt layer, and an Au layer are sequentially formed. Alternatively, the pad electrode may be made of titanium (Ti)/gold (Au) or nickel (Ni)/gold (Au). The uppermost layer of the pad electrode 23 is preferably an Au layer to perform wire bonding.

An insulating film 21 made of $SiO_2$ is preferably formed on portions of the p-type cladding layer 15 located at sides of the cladding electrode 22 to protect the surfaces. In this case, since the pad electrode 23 is formed not only on the cladding electrode 22 but on the insulating film 21, the width of the pad electrode 23 is greater than the width We of the cladding electrode 22.

An n-type electrode 24 is preferably formed on the surface (i.e., the back surface) of the substrate 10 opposite to the surface formed with the n-type cladding layer 11.

The mesa structure 20 according to this embodiment is a straight waveguide. A front facet coat 25, which is a dielectric single layer film or a dielectric multilayer film, is preferably formed on a front facet (i.e., a light-emitting facet) emitting light. On the other hand, a rear facet coat 26, which is a dielectric multilayer film, is preferably formed on a rear facet.

The reference characters c, a, and m in FIGS. 1-3 represent plane orientations of hexagonal GaN crystal. Specifically, c represents the normal vector of the (0001) plane, i.e., a c-axis. The reference character a represents the normal vector of the (11-20) plane and equivalent planes, i.e., an a-axis. The reference character m represents the normal vector of the (1-100) plane and equivalent planes, i.e., an m axis. In the present specification, the negative signs "-" assigned to the Miller indices of the plane orientations represent conversion of the indices following the negative signs for convenience.

In this embodiment, the principal surface of the substrate 10 has the plane orientation (0001), and the front facet and the rear facet have the plane orientation (1-100). That is, an example has been described where the plane orientations of the principal surface of the substrate 10, the front facet, and the rear facet are the most common ones. However, the present disclosure is not limited thereto, and any plane orientation may be used.

Manufacturing Method

A method of manufacturing the semiconductor light-emitting device according to the first embodiment will be described below with reference to FIGS. 5A-5E and 6A-6D. FIGS. 5A-6D are cross-sectional views illustrating the method of manufacturing the semiconductor light-emitting device according to this embodiment.

Step of Crystal Growth

Figure 5A:
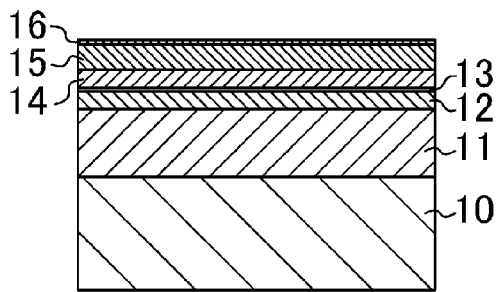
FIGS. 5A-5E are cross-sectional views illustrating a method of manufacturing the semiconductor light-emitting device according to the first embodiment.

First, as shown in FIG. 5A, for example, the n-type buffer layer (not shown) having a thickness of 1 μm and made of n-type GaN, and the n-type cladding layer 11 having a thickness of 2 μm and made of n-type $Al_{0.05}Ga_{0.95}N$ are sequentially grown by metal-organic chemical vapor deposition (MOCVD) on the principal surface of the substrate 10 made of n-type hexagonal GaN with a carrier concentration of about $1 \times 10^{18}$ cm$^{-3}$. The plane orientation of the principal surface of the substrate 10 is the (0001) plane.

Then, the n-type guide layer 12 having a thickness of 0.10 μm and made of n-type GaN, and the MQW active layer 13, which is formed by repeatedly stacking three pairs of a barrier layer made of $In_{0.02}Ga_{0.98}N$ and an MQW layer made of $In_{0.16}Ga_{0.84}N$, are sequentially grown on the n-type cladding layer 11.

Next, the p-type guide layer 14 having a thickness of 0.05 μm and made of p-type GaN is grown on the active layer 13. After that, the p-type cladding layer 15, which is formed by repeatedly stacking 50 pairs of a p-type $Al_{0.10}Ga_{0.90}N$ layer with a thickness of 1.5 nm and a GaN layer with a thickness of 1.5 nm, and the p-type contact layer 16 having a thickness of 0.05 μm and made of p-type GaN are sequentially grown on the p-type guide layer 14. The p-type cladding layer 15 is a strained superlattice layer with a thickness of 0.15 μm.

As a result, the semiconductor multilayer is formed, in which the n-type buffer layer, the n-type cladding layer 11, the n-type guide layer 12, the active layer 13, the p-type guide layer 14, the p-type cladding layer 15, and the p-type contact layer 16 are sequentially stacked on the substrate 10.

The n-type semiconductor layers (specifically, the n-type buffer layer, the n-type cladding layer 11, and the n-type guide layer 12) are doped with silicon (Si) as donor impurities at a concentration ranging from about $5\times10^{17}$ cm$^{-3}$ to about $10\times10^{17}$ cm$^{-3}$. The p-type semiconductor layers (specifically, the p-type guide layer 14 and the p-type $Al_{0.10}Ga_{0.90}N$ layers of the p-type cladding layer 15) except for the p-type contact layer 16 are doped with magnesium (Mg) as acceptor impurities at a concentration of about $1\times10^{19}$ cm$^{-3}$. The p-type contact layer 16 is doped with Mg at a high concentration of about $1\times10^{20}$ cm$^{-3}$.

While in this embodiment, an example has been described where MOCVD is used for crystal growth in forming the semiconductor multilayer, the present disclosure is not limited thereto. For example, a method such as molecular beam epitaxy (MBE) or chemical beam epitaxy (CBE), which is capable of growing GaN semiconductor layers, may be used for crystal growth.

In forming a semiconductor multilayer by MOCVD as in this embodiment, for example, trimethylgallium (TMG) may be used as a Ga material, trimethylindium (TMI) may be used as an In material, trimethylaluminum (TMA) may be used as an Al material, and ammonia ($NH_3$) may be used as an N material. Silane ($SiH_4$) gas may be used as the Si material being the n-type impurities, and bis-cyclopentadienyl magnesium ($Cp_2Mg$) may be used as the Mg material being the p-type impurities.

Step of Forming Mesa Structure

Next, a $SiO_2$ film with a thickness of 200 nm is deposited by CVD on the entire surface of the substrate 10. Then, heat treatment is performed under a nitrogen ($N_2$) atmosphere at a temperature of 850° C. for 20 minutes. This activates the Mg implanted into the p-type semiconductor layers. After that, as shown in FIG. 5B, a mask film 70 made of $SiO_2$ is formed on the region of the contact layer 16 formed with the mesa structure (see reference numeral 20 of FIG. 5C) by lithography and dry etching such as reactive ion etching (RIE). Then, inductively coupled plasma (ICP) dry etching is performed using the mask film 70, and chlorine-based gas such as chlorine ($Cl_2$) gas, silicon tetrachloride ($SiCl_4$) gas, and boron trichloride ($BCl_3$) gas. As a result, as shown in FIG. 5C, the mesa structure 20 is formed, which includes the raised portion 15a of the p-type cladding layer 15 and the contact layer 16.

At this time, due to damages or lack of nitrogen (N) in dry etching, the upper portions of the side portions of the p-type nitride semiconductor cladding layer 15 located at the sides of the mesa structure 20 have n-type conductivity. Thus, a surface layer (not shown) having the conductivity type (i.e., n-type) opposite to that of the p-type cladding layer 15 is formed.

At this time, the upper surface of the side portion of the p-type cladding layer 15 located at each side of the mesa structure 20 is exposed to chlorine-based plasma, and becomes the high-resistive surface 15s.

The etching depth is, for example, 0.15 µm. The "etching depth" is the distance between the upper surface of the mesa structure 20 (i.e., the upper surface of the contact layer 16) and the lower surface of the mesa structure 20 (the lower surface of the raised portion 15a of the p-type cladding layer 15). The mesa structure 20 has a width of, for example, 1.5 µm.

After that, the mask film 70 is removed by hydrofluoric acid treatment using buffered hydrogen fluoride (BHF) solution.

Step of Forming Insulating Film and Cladding Electrode

Figure 5D:
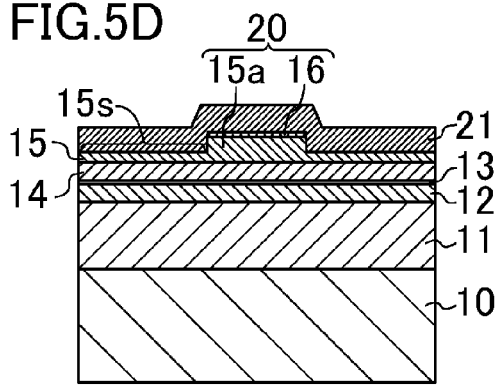
Figure 5B:
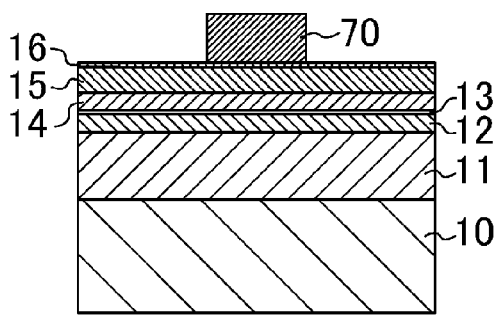
Figure 5E:
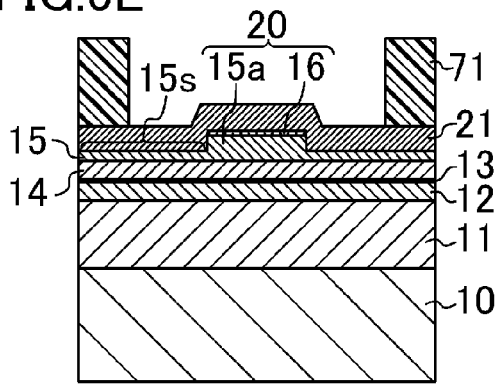
Figure 5C:
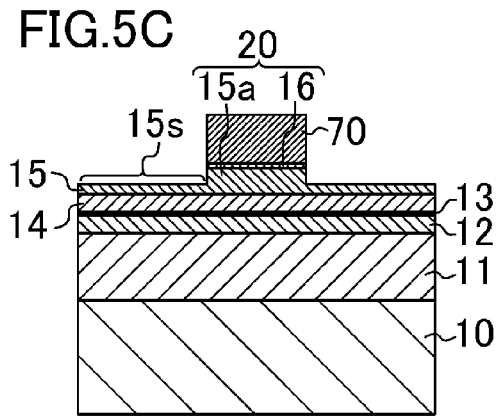

Next, as shown in FIG. 5D, the insulating film 21 having a thickness of 300 nm and made of $SiO_2$ is deposited by CVD on the entire surface of the substrate 10. Then, a resist 71 having an opening is formed on the insulating film 21 by lithography.

Figure 6A:
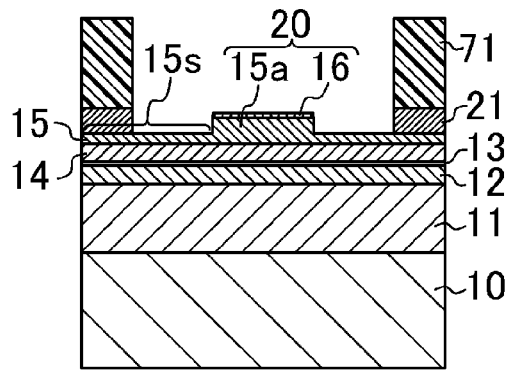
FIGS. 6A-6D are cross-sectional views illustrating the method of manufacturing the semiconductor light-emitting device according to the first embodiment.

Then, wet etching with BHF solution is performed using the resist 71 as a mask. As a result, as shown in FIG. 6A, an opening exposing the entire mesa structure 20 is formed in the insulating film 21. The opening of the insulating film 21 has an opening width of, for example, 5 µm. After that, the resist 71 is removed by organic cleaning.

Figure 6B:
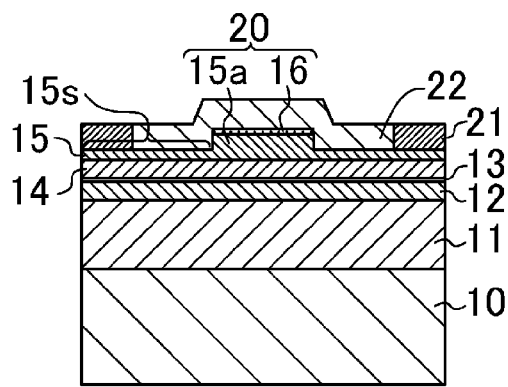

After that, as shown in FIG. 6B, the cladding electrode 22 made of ITO is formed in the opening of the insulating film 21 by electron-beam deposition. The cladding electrode 22 has a thickness of, for example, 200 nm. Then, heat treatment is performed under an oxygen ($O_2$) atmosphere at a temperature of 600° C. As a result, an excellent contact resistance of $5\times10^{-4}$ $\Omega cm^2$ or less is provided.

Step of Forming Pad Electrode

Figure 6C:
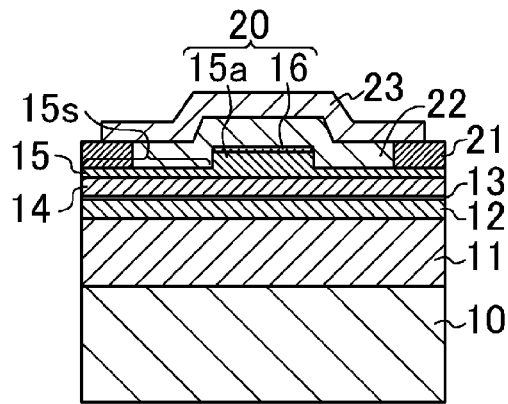

Next, as shown in FIG. 6C, the pad electrode 23 made of Ti/Pt/Au is formed on the cladding electrode 22 and the insulating film 21 by lithography and electron-beam deposition to be electrically coupled to the cladding electrode 22. The Ti layer, the Pt layer, and the Au layer have thicknesses of, for example, 50 nm, 50 nm, and 500 nm, respectively.

The substrate 10 is in the form of wafer. A plurality of semiconductor light-emitting devices are formed in a matrix on the principal surface of the substrate 10. Thus, the substrate 10 in the form of wafer will be divided into semiconductor light-emitting devices in a later step (see the step of cleavage and assembly, which will be described later).

If the pad electrode 23 is continuously formed across an adjacent pair of the semiconductor light-emitting devices, the cladding electrode 22 adhered to the pad electrode 23 may be removed from the contact layer 16 when the wafer is divided into the semiconductor light-emitting devices. Thus, the pad electrodes 23 are preferably formed separately from each other in the two of each adjacent pair of the semiconductor light-emitting devices.

If the Au layer, which is the upper layer of the pad electrode 23, is formed to have a thickness of 3 µm or more by electrolytic plating, generated heat from the active layer 13 can be effectively released. The plated electrode having a thickness of 3 µm or more and made of Au improves the reliability of the semiconductor light-emitting device.

Step of Forming N-Type Electrode

Figure 6D:
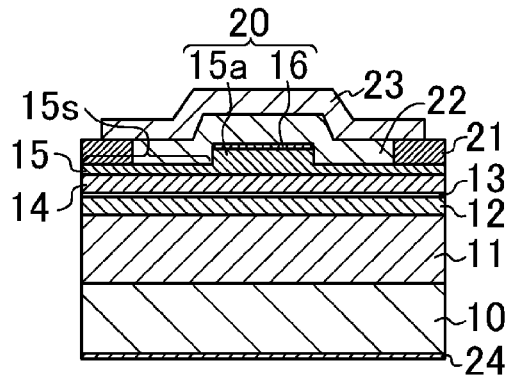

Next, as shown in FIG. 6D, the portion of the back surface of the substrate 10, which is opposite to the surface formed with the n-type cladding layer 11, is polished. As a result, the substrate 10 has a thickness of, for example, 100 µm. The substrate 10 may be polished by mechanical polishing using polish such as diamond slurry and colloidal silica, or chemical mechanical polishing using, for example, alkaline solution such as potassium hydroxide (KOH) solution.

After that, the n-type electrode 24 made of Ti/Pt/Au is formed on the back surface of the substrate 10. The Ti layer, the Pt layer, and the Au layer have thicknesses of, for example, 10 nm, 50 nm, and 100 nm, respectively. This structure provides an excellent contact resistance of about $1 \times 10^{-4}$ $\Omega$cm$^2$.

A pattern is preferably formed by lithography and wet etching in the Au layer, which is the upper layer of the pad electrode 23, as a recognition pattern in the following step of cleavage and assembly, thereby forming an electrode pattern. Alternatively, an electrode pattern may be formed by lithography or deposition lift-off.

Step of Cleavage and Assembly

Next, breaking is performed along a first cutting plane line so that the substrate 10 in the form of wafer is subjected to first cleavage. This forms the front facet and the rear facet. The first cutting plane line extends in the direction perpendicular to the longitudinal direction of a cavity. Before the first cleavage, a groove is formed along the first cutting plane line by scribing with a diamond stylus or a laser beam, and may be used as an auxiliary groove for the first cleavage. The groove may be formed only in the ends of the first cutting plane line, and may be formed in a dashed line between an adjacent pair of the semiconductor light-emitting devices.

Then, a rear facet coat (see reference numeral 26 in FIGS. 1 and 2) being a dielectric multilayer film with a reflectivity of 90% or more is formed on the rear facet by CVD, sputtering, etc. After that, the front facet coat (see reference numeral 25 in FIGS. 1 and 2) being a dielectric single layer film or a dielectric multilayer film with a reflectivity ranging from several to tens of percentages is formed on the front facet by CVD, sputtering, etc.

Next, after an auxiliary groove is formed along a second cutting plane line by scribing with a diamond stylus or a laser, the substrate 10 is subjected to second cleavage. The second cutting plane line extends in the direction parallel to the longitudinal direction of the cavity.

As such, the substrate 10 in the form of wafer is divided into the semiconductor light-emitting devices.

As described above, the semiconductor light-emitting device according to this embodiment is manufactured.

The semiconductor light-emitting device (e.g., a semiconductor laser diode) according to this embodiment is mounted in a desired package such as a CAN package and is then coupled using wires.

Functions and Advantages

Figure 4:
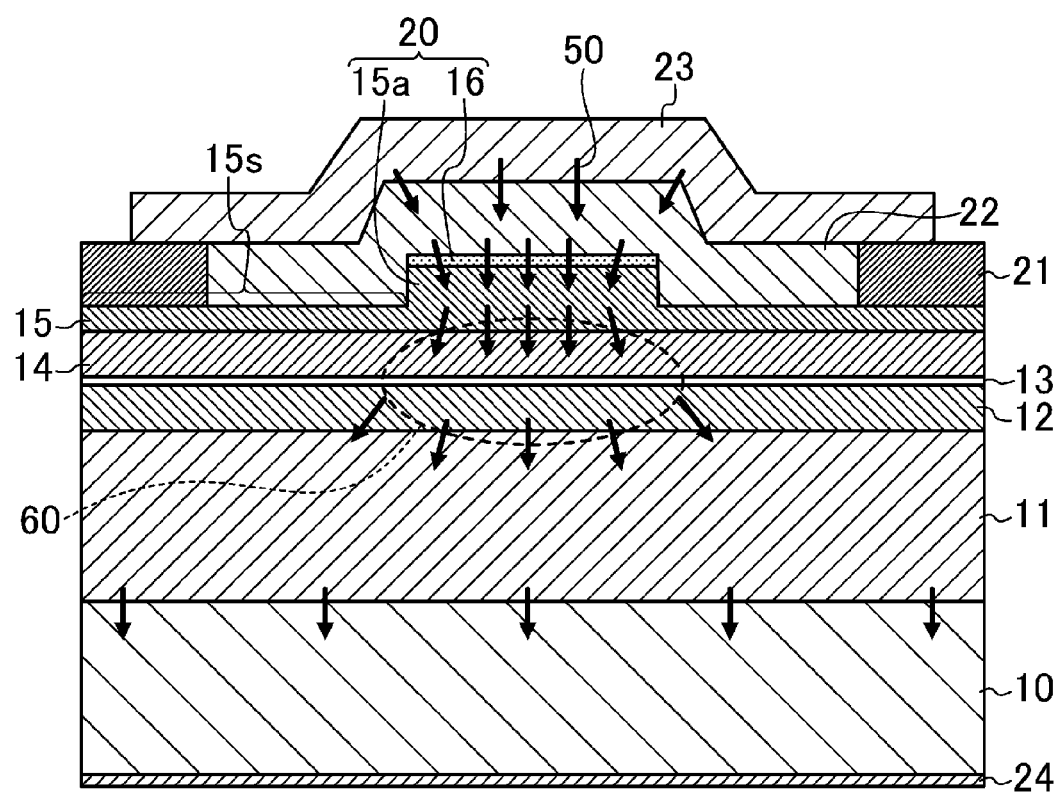
FIG. 4 is a schematic view illustrating the operation of the semiconductor light-emitting device according to the first embodiment.

Functions and advantages of the semiconductor light-emitting device according to this embodiment will be described below with reference to FIG. 4. FIG. 4 is a schematic view illustrating the operation of the semiconductor light-emitting device according to this embodiment.

As shown in FIG. 4, the width (see We in FIG. 3) of the cladding electrode 22 made of conductive metal oxide is greater than the width (see Ws in FIG. 3) of the mesa structure 20, thereby stably fabricating a highly symmetric optical confinement structure. As a result, a highly efficient semiconductor light-emitting device reducing an increase in the threshold current can be provided.

In this embodiment, the cladding electrode 22 is formed not only on the upper surface and the side surfaces of the mesa structure 20, but also on the upper surfaces of the side portions of the p-type cladding layer 15 located at the sides of the mesa structure 20 (hereinafter, also simply referred to as "side portions of the p-type cladding layer 15"). The present inventor wondered if flow of currents to the side portions of the p-type cladding layer 15 might reduce the efficiency.

However, indeed, the present inventor found that currents hardly flow to the side portions of the p-type cladding layer 15. Possible reasons are as follows.

First, due to damages or lack of nitrogen (N) in the ICP dry etching (see FIG. 5C), the upper portions of the side portions of the p-type nitride semiconductor cladding layer 15 have n-type conductivity. Thus, the surface layer (not shown) having the conductivity type (i.e., n-type) opposite to that of the p-type cladding layer 15 is formed.

Second, the upper surface of each side portion of the p-type cladding layer 15 is exposed to the chlorine-based plasma in the ICP dry etching using the chlorine-based gas, and becomes the high-resistive surface 15s. Thus, the side portions of the p-type cladding layer 15 are in Schottky contact with the cladding electrode 22.

Therefore, currents flow in current directions 50 shown in FIG. 4. That is, as shown in FIG. 4, the currents flow from the pad electrode 23 through the contact layer 16 and the portion of the p-type cladding layer 15 immediately under the contact layer 16 to the active layer 13. As such, the currents hardly flow to the side portions of the p-type cladding layer 15.

In this embodiment, since the currents hardly flow to the side portions of the p-type cladding layer 15, there is almost no spatial difference between light distribution 60 of the light waveguide and a light-emitting portion, and the light distribution 60 almost entirely overlaps the light-emitting portion, thereby causing no decrease in efficiency.

Not to influence the symmetry of the light distribution, the cladding electrode 22 preferably has a sufficiently greater width than the light distribution. As a result of calculation of the light distribution, and measurement of a light-emitting near field pattern (NFP), the present inventor found that the symmetry of the light distribution is hardly influenced, as long as each side surface of the cladding electrode 22 is 0.5 µm or more distant from the closer one of the side surfaces of the mesa structure 20. As long as the width of the cladding electrode 22 is greater than or equal to the sum of the width of the mesa structure and the doubled expansion width of the light distribution to the outside of the mesa structure, the symmetry of the light distribution is hardly influenced. In this embodiment, since the width of the mesa structure 20 is 1.5 µm, the width of the cladding electrode 22 may be 2.5 µm or more. In view of facilitated fabrication and the design margin, the width of the cladding electrode 22 (the width of the opening in the insulating film 21) is 5 µm.

In this embodiment, the distance (see reference character d in FIG. 3, i.e., the etching depth) between the upper surface and the lower surface of the mesa structure 20 is 0.15 µm (i.e., 150 nm). The distance may be different. However, the distance between the upper surface and the lower surface of the mesa structure 20 preferably ranges from 10 nm to 200 nm, both inclusive. The upper surface of the mesa structure 20 according to this embodiment is defined by the upper surface of the contact layer 16, and the lower surface of the mesa structure 20 is defined by the upper surface of the region of the p-type cladding layer (i.e., the second cladding layer) 15 without the raised portion 15a.

Where a p-type electrode is made of metal as in a comparative example (see the following FIG. 8A), the distance between the upper surface and the lower surface of a mesa structure needs to be 0.4 µm (i.e., 400 nm) or more. Otherwise, the p-type electrode absorbs light to deteriorate the characteristics. However, where the cladding electrode 22 made of transparent conductive metal oxide is used as a p-type electrode as in this embodiment, the p-type electrode does not absorb light. Thus, the thickness of the p-type cladding layer 15 can be reduced.

Where the distance between the upper surface and the lower surface of the mesa structure 20 is 200 nm or less, the thickness of the p-type cladding layer 15 is half the thickness in the comparative example, thereby reducing an operating voltage. On the other hand, the present inventor confirmed that the lateral optical confinement is sufficiently increased where the distance between the upper surface and the lower surface of the mesa structure 20 is 10 nm or more. Therefore, the distance between the upper surface and the lower surface of the mesa structure 20 preferably ranges from 10 nm to 200 nm, both inclusive.

The cladding electrode 22 made of conductive metal oxide covers the upper surface and the side surfaces of the thin mesa structure 20, whose upper surface is apart from the lower surface by a distance ranging from 10 nm to 200 nm, both inclusive. This increases the lateral optical confinement and reduces an increase in the threshold current, while reducing the operating voltage.

Next, the advantage of increasing the yields will be described.

A light-emitting device according to the comparative example is experimentally produced such that a cladding electrode is formed only on the upper surface of the mesa structure, i.e., the width of the cladding electrode is equal to the width of the mesa structure. As a result, the present inventor found that a semiconductor light-emitting device having an accurate and stable structure could be fabricated at high yields in this embodiment, as compared to the comparative example.

Figure 23:
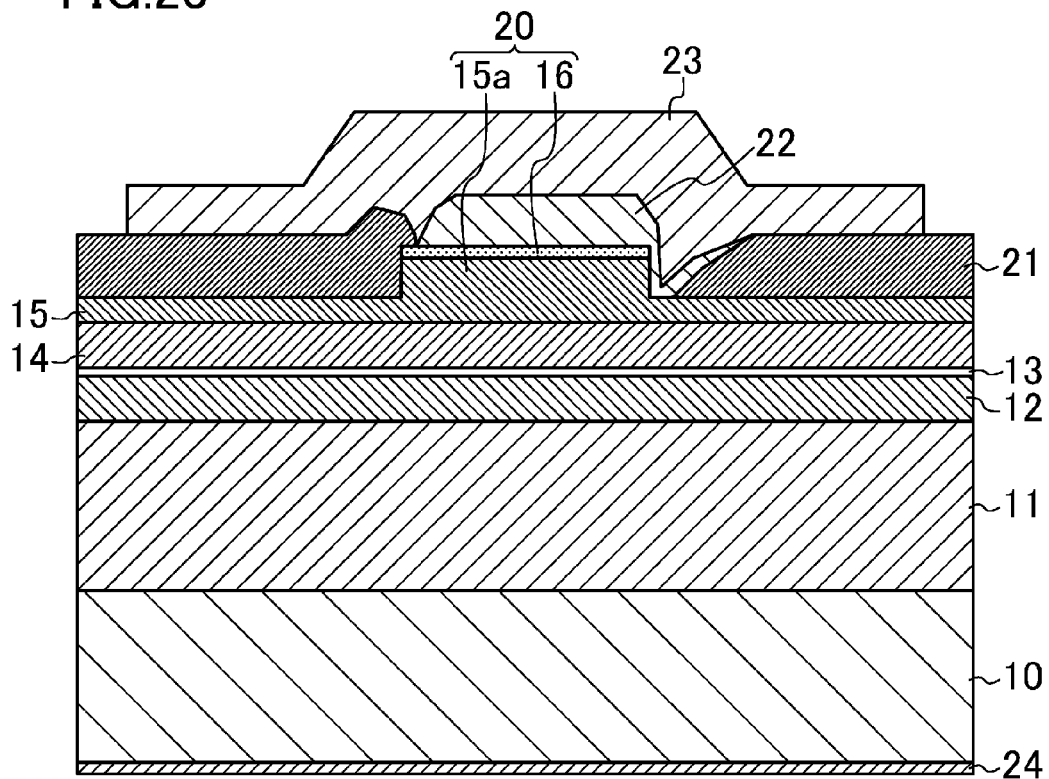
FIG. 23 is a cross-sectional view illustrating the structure of a light-emitting device according to a comparative example.
Figure 24A:
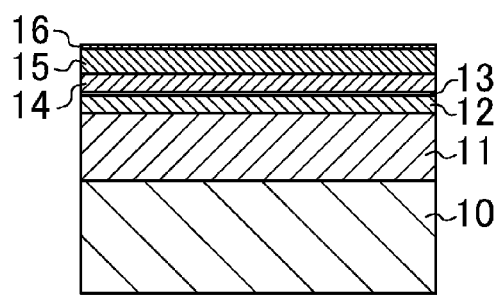
FIGS. 24A-24E are cross-sectional views illustrating a method of manufacturing the light-emitting device according to the comparative example.
Figure 24D:
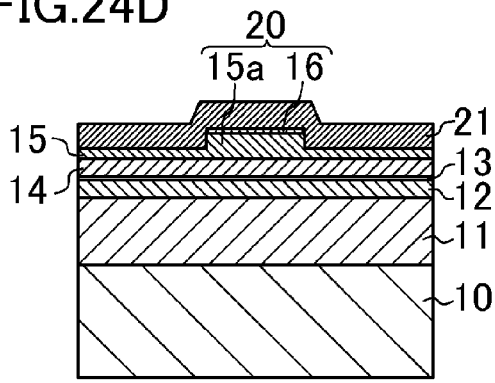
Figure 24B:
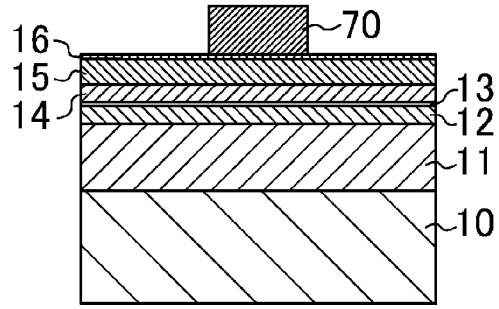
Figure 24E:
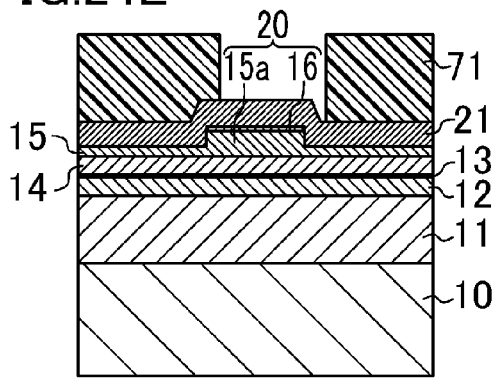
Figure 24C:
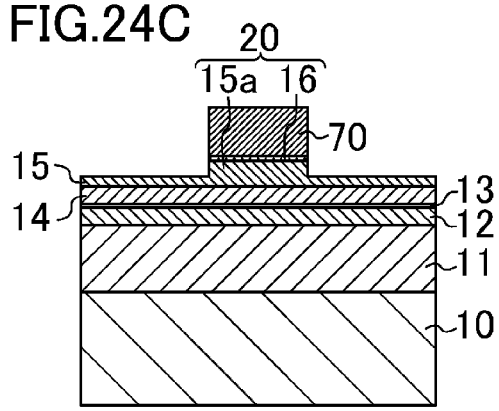
Figure 25A:
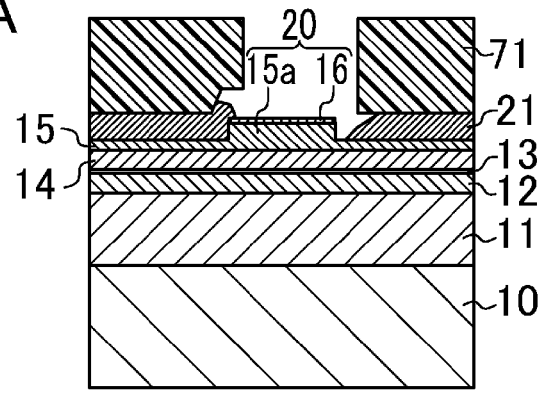
FIGS. 25A-25D are cross-sectional views illustrating the method of manufacturing the light-emitting device according to the comparative example.
Figure 25B:
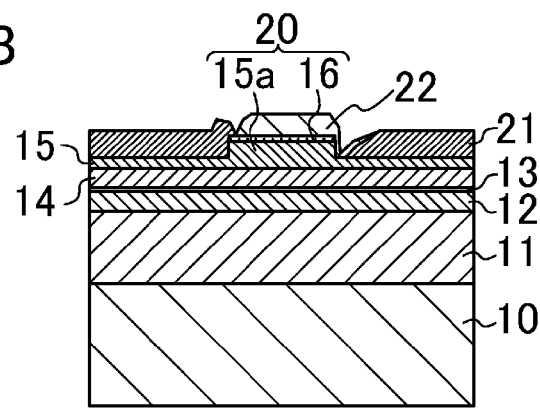
Figure 25C:
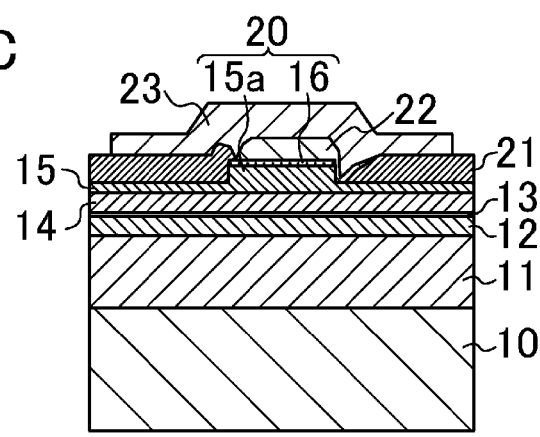
Figure 25D:
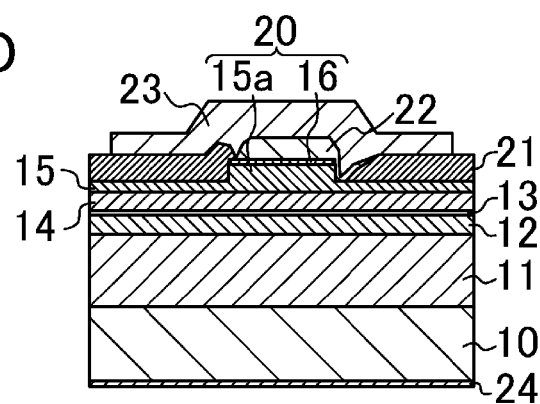

The reason for the low yields of the light-emitting device according to the comparative example is as follows. FIG. 23 is a cross-sectional view illustrating the structure of the light-emitting device according to the comparative example. FIGS. 24A-24E and 25A-25D are cross-sectional views illustrating a method of manufacturing the light-emitting device according to the comparative example. After the formation of the mesa structure 20 (see FIG. 24C), as shown in FIG. 24D, an insulating film 21 is formed on the entire surface of a substrate 10. Then, a resist 71 having an opening is formed on the insulating film 21 by lithography using a resist and a mask. The present inventor tried to form the opening in the resist such that the opening plane of the opening is aligned with the upper surface of the mesa structure 20. However, since the accuracy of the opening of the resist depends on the accuracy in alignment of the mask, the upper surface of the mesa structure 20 is shifted from the opening plane of the opening of the resist 71 by a maximum distance ranging from about 0.1 μm to about 0.2 μm as shown in FIG. 24E in using a g-ray or i-ray stepper exposing apparatus. Thus, as shown in FIG. 25A, not the entire upper surface of the mesa structure 20 is exposed from the opening of the insulating film 21, and but only part of the upper surface of the mesa structure 20 is exposed from the opening of the insulating film 21. Then, as shown in FIG. 25B, the cladding electrode 22 cannot be formed on the entire upper surface of the mesa structure 20, and is shifted from a portion immediately on the mesa structure 20. As a result, part of the pad electrode 23 overlaps the light distribution and absorbs light, thereby reducing the efficiency. Therefore, the light-emitting device according to the comparative example provides low yields.

By contrast, in this embodiment, since the width of the cladding electrode 22 made of conductive metal oxide is greater than the width of the mesa structure 20, the shift as in the comparative example (specifically, the shift of the cladding electrode 22 from the portion immediately on the mesa structure 20) hardly occurs. Therefore, the semiconductor light-emitting device having an accurate and stable structure can be fabricated at high yields.

The following two techniques are considered to avoid the shift of the cladding electrode 22 from the portion immediately on the mesa structure 20.

The first technique is called resist etch-back. This technique exposes only the upper surface of the mesa structure by covering the mesa structure and uniformly removing the resist which has been applied flat. In this technique, the upper surface needs to be apart from the lower surface of the mesa structure by a distance to some extent to expose only the upper surface of the mesa structure. However, after various studies, the present inventor clarified that only the upper surface of the mesa structure cannot be exposed and this technique is not applicable, if the distance between the upper surface and the lower surface of the mesa structure ranges from 10 nm to 200 nm, both inclusive.

The other technique is to form the mesa structure in a self-alignment manner by dry etching using the cladding electrode itself as a mask. This technique uses the cladding electrode itself as the mask, only the ends of the cladding electrode may be removed in dry etching or the contact resistance may increase due to damage by dry etching. After various studies, the present inventor clarified that currents are non-uniformly supplied in the mesa structure, thereby deteriorating the characteristics.

As clear from the foregoing, as in this embodiment, the width of the cladding electrode 22 is formed greater than the width of the mesa structure 20, thereby providing a semiconductor light-emitting device having an accurate and stable structure is simply fabricated.

As described above, this embodiment provides a highly efficient semiconductor light-emitting device reducing an increase in the threshold current. In addition, an increase in the threshold current is reduced and the operating voltage is lowered. Furthermore, a semiconductor light-emitting device having an accurate and stable structure is simply fabricated at high yields.

In this embodiment, an example has been described where the semiconductor light-emitting device is a semiconductor laser diode. However, the semiconductor light-emitting device may be a superluminescent diode (SLD), which provides advantages similar to those of this embodiment. In particular, an SLD is suitable for the structure according to this embodiment, since the characteristics improve with an increase in the optical confinement.

Variation of First Embodiment

Figure 7:
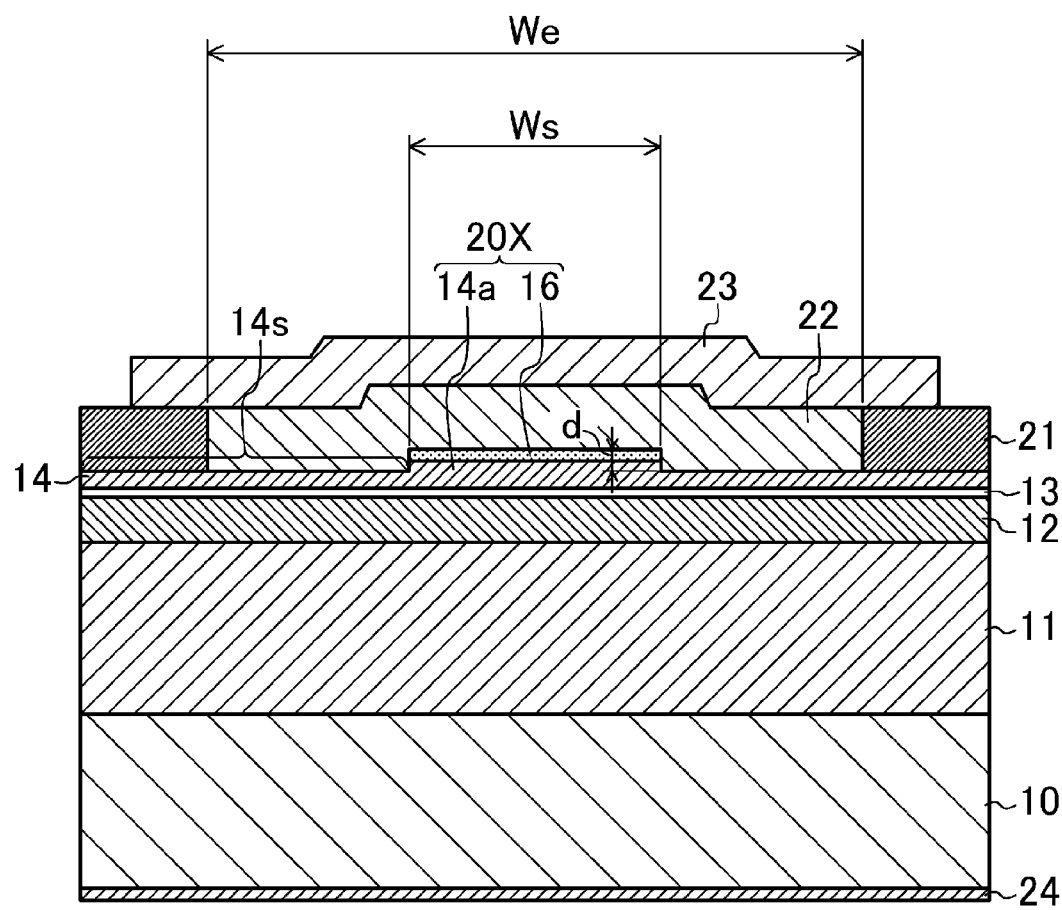
FIG. 7 is a cross-sectional view illustrating the structure of a semiconductor light-emitting device according to a variation of the first embodiment.

A semiconductor light-emitting device according to a variation of the first embodiment will be described below with reference to FIG. 7. FIG. 7 is a cross-sectional view illustrating the structure of the semiconductor light-emitting device according to this variation.

As shown in FIG. 7, the p-type cladding layer (see reference numeral 15 in FIG. 3) may be omitted. In this case, a p-type guide layer 14 has a raised portion 14a. A mesa structure 20X includes the raised portion 14a of the p-type guide layer 14, and a contact layer 16 formed on the raised portion 14a.

The upper surface of a portion of the p-type guide layer 14 located at each side of the mesa structure 20X is a high-resistive surface 14s.

The distance d between the upper surface and the lower surface of the mesa structure 20X is preferably 10 nm or more and less than 50 nm. The upper surface of the mesa structure 20X according to this variation is defined by the upper surface of the contact layer 16, and the lower surface of the mesa structure 20X is defined by the upper surface of the region of the p-type guide layer 14 without the raised portion 14a. If the distance between the upper surface and the lower surface of the mesa structure 20X is 50 nm or more, light distribution is drawn to the upper portion of the mesa structure 20X and spatially different from the light-emitting portion, thereby causing a decrease in efficiency.

This variation provides advantages similar to those of the first embodiment. In addition, a cladding electrode 22 made of conductive metal oxide is used to omit the p-type cladding layer. A lower operating voltage is provided by omitting the p-type cladding layer with high resistance. Furthermore, the distance between the upper surface and the lower surface of the mesa structure 20X can be reduced by omitting the p-type cladding layer.

Figure 8A:
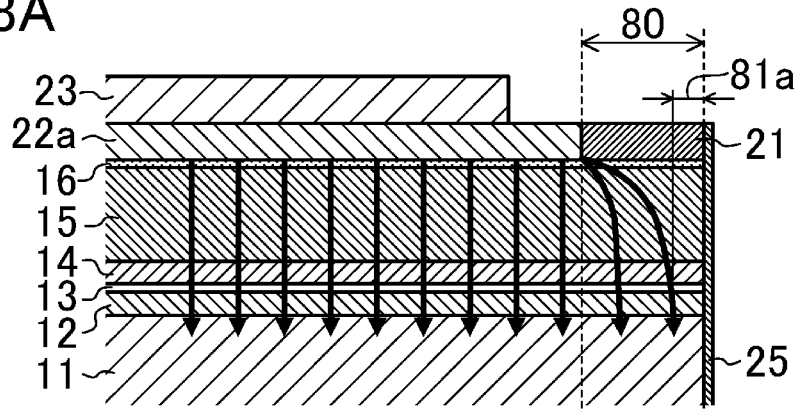
FIGS. 8A-8C are cross-sectional views illustrating the structures of part of the semiconductor light-emitting devices, more particularly portions near front facets.
Figure 8B:
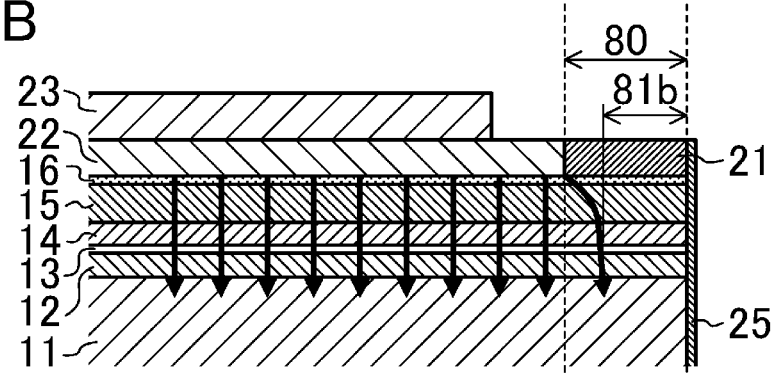
Figure 8C:
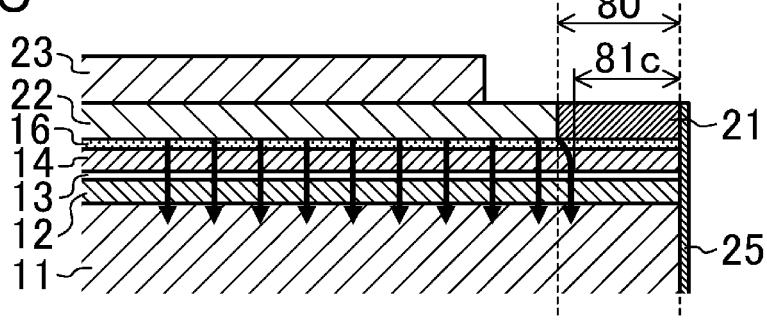

Other advantages will be described below with reference to FIGS. 8A-8C. FIGS. 8A-8C are cross-sectional views illustrating the structures of part of the semiconductor light-emitting devices, more specifically the portions near the front facets. FIGS. 8A-8C are cross-sectional views along the direction parallel to the extending direction of the mesa structures. FIGS. 8A, 8B, and 8C are cross-sectional views illustrating the structures of part of the light-emitting device according to the comparative example, the first embodiment, and the variation of the first embodiment, respectively.

As shown in FIG. 8A, the light-emitting device according to the comparative example uses a p-type electrode 22a made of metal instead of a cladding electrode (see reference numeral 22 in FIG. 8B) made of conductive metal oxide according to the first embodiment.

As shown in FIGS. 8A-8C, a non-doped width 80 of a non-doped portion is, for example, 5 µm. The non-doped portion is for reducing heat generation at facets due to currents, and emitting and non-emitting states of light. The non-doped portion increases the maximum light output and improves the reliability.

However, in the comparative example, since the p-type cladding layer 15 has a great thickness, the interface between the p-type electrode 22a and the contact layer 16 is spaced a long distance apart from the active layer 13. Thus, the expansion of currents between the interface and the active layer 13 reduces an actual non-doped width 81a.

By contrast, in the first embodiment, since the p-type cladding layer 15 has a small thickness, and the interface between the cladding electrode 22 and the contact layer 16 is spaced a small distance apart from the active layer 13. This reduces the expansion of currents between the interface and the active layer 13, thereby increasing an actual non-doped width 81b. Therefore, the advantages of increasing the maximum light output and improving the reliability are largely obtained.

In the variation of the first embodiment, since the p-type cladding layer (see reference numeral 15 of FIG. 8B) is omitted, the interface between the cladding electrode 22 and the contact layer 16 is spaced a smaller distance apart from the active layer 13. This further reduces the expansion of currents between the interface and the active layer 13, thereby further increasing an actual non-doped width 81c. Therefore, the advantages of increasing the maximum light output and improving the reliability are more largely obtained.

Second Embodiment

Figure 9:
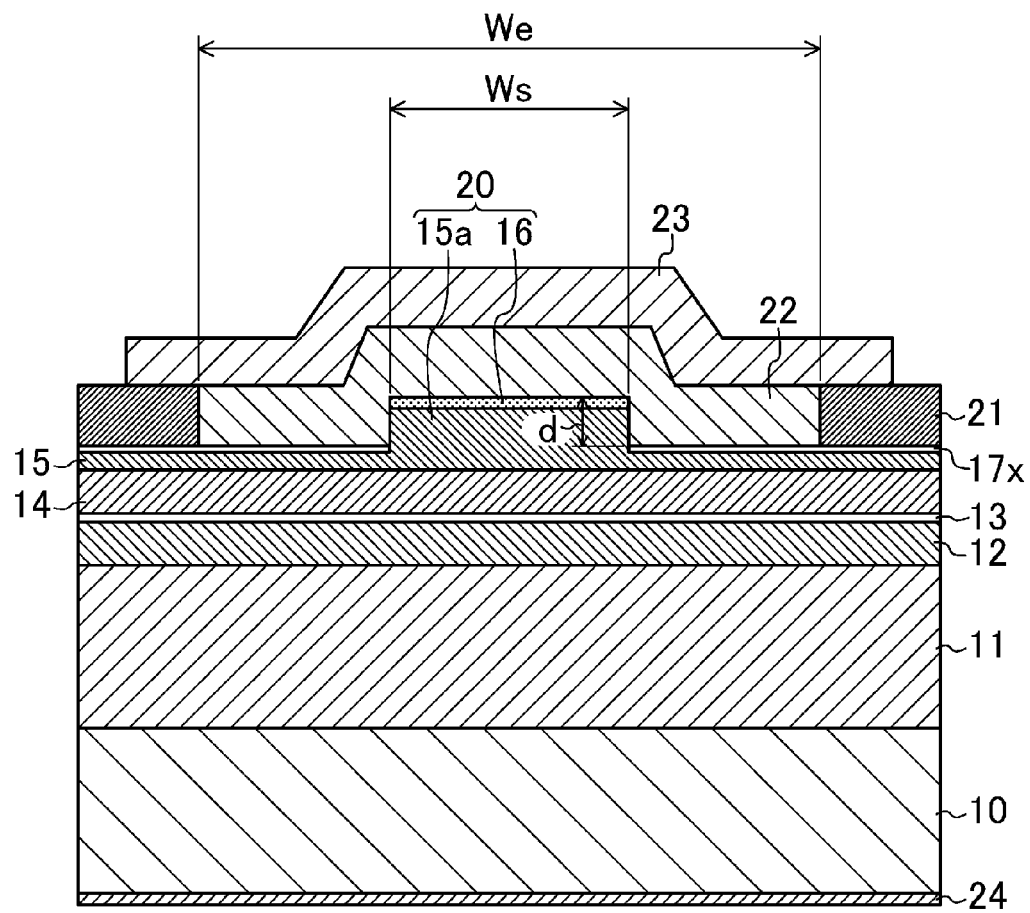
FIG. 9 is a cross-sectional view illustrating the structure of a semiconductor light-emitting device according to a second embodiment.

A semiconductor light-emitting device according to a second embodiment will be described below with reference to FIGS. 9, 10A-10E, and 11A-11D. FIG. 9 is a cross-sectional view illustrating the structure of the semiconductor light-emitting device according to this embodiment. FIGS. 10A-11D are cross-sectional views illustrating a method of manufacturing the semiconductor light-emitting device according to this embodiment. In FIGS. 9 and 10A-11D, the same reference characters as those shown in the first embodiment, i.e., FIGS. 1-4 and 5A-6D are used to represent equivalent elements. Thus, repetitive explanation of the first embodiment will be omitted in this embodiment.

As shown in FIG. 9, a high resistive portion 17x is formed on the upper portion of the side portion of a p-type cladding layer 15 located at each side of a mesa structure 20. The high resistive portion 17x is a modified portion obtained by modifying the upper portion of each side portion of the p-type cladding layer 15 by plasma treatment. The high resistive portion 17x contains the element derived from the plasma used in the plasma treatment. The high resistive portion 17x contains, for example, fluorine (F) or oxygen (O).

Figure 10A:
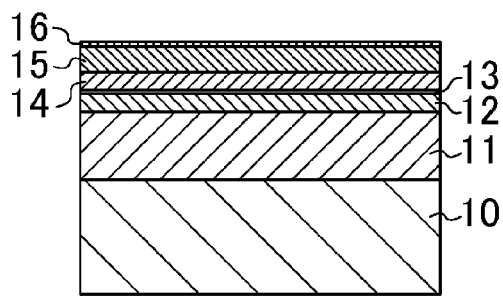
FIGS. 10A-10E are cross-sectional views illustrating a method of manufacturing the semiconductor light-emitting device according to the second embodiment.
Figure 10B:
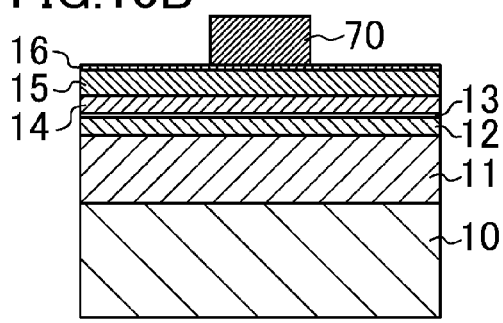
Figure 10C:
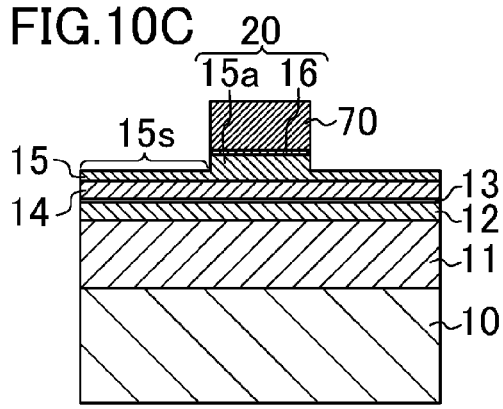
Figure 10D:
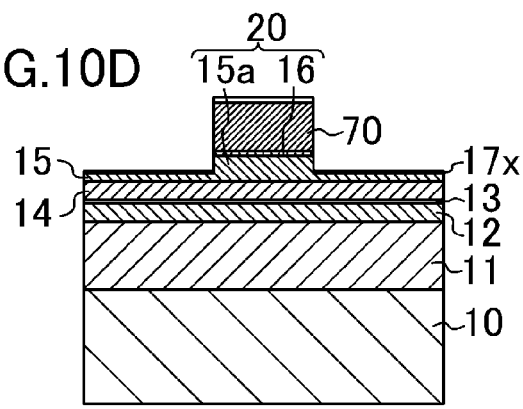
Figure 10E:
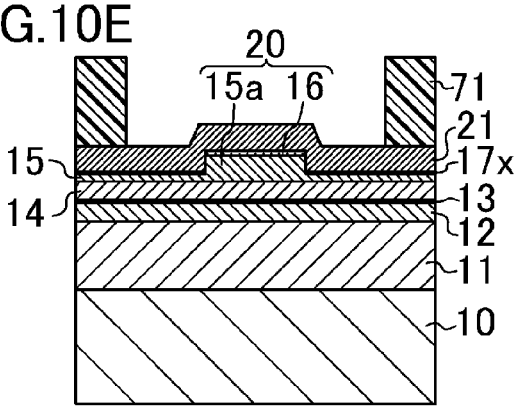
Figure 11A:
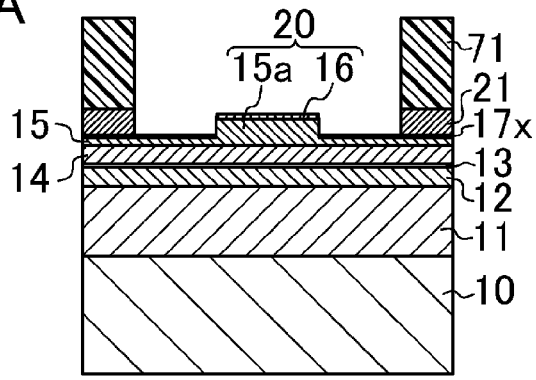
FIGS. 11A-11D are cross-sectional views illustrating the method of manufacturing the semiconductor light-emitting device according to the second embodiment.
Figure 11B:
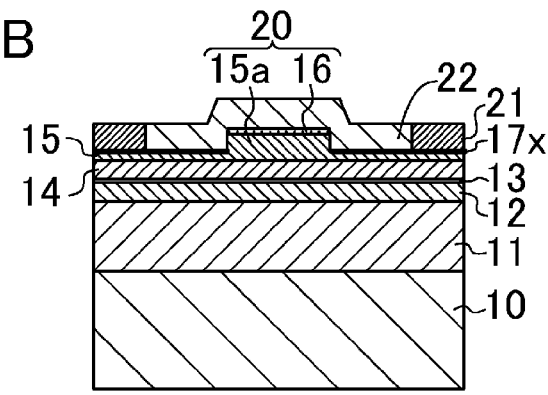
Figure 11C:
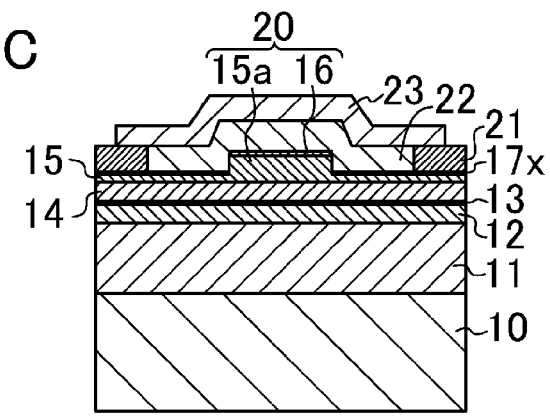
Figure 11D:
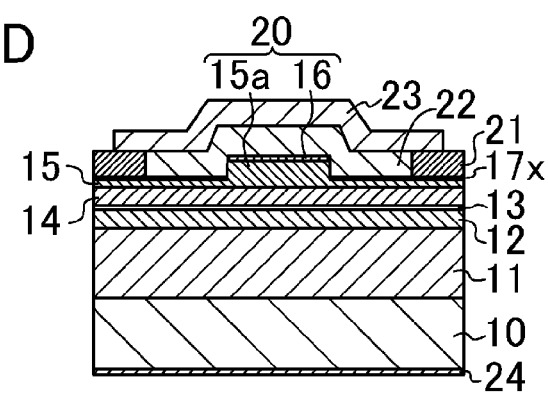

Each high resistive portion 17x is formed as follows. After the formation of the mesa structure 20 (see FIG. 10C), as shown in FIG. 10D, plasma treatment using fluorine (F) plasma is performed. This modifies the upper portion of each side portion of the p-type cladding layer 15 to form the high resistive portion 17x. Oxygen (O) plasma may be used instead of the F plasma.

This embodiment provides advantages similar to those of the first embodiment. In addition, the formation of the high resistive portion 17x further increases the resistance at the upper portion of each side portion of the p-type cladding layer 15. This further increases the interface resistance between the side portion of the p-type cladding layer 15 and a cladding electrode 22. Furthermore, the plasma treatment modifies only the portion near the upper surface of each side portion of the p-type cladding layer 15, thereby hardly influencing light absorption, etc.

Third Embodiment

Figure 12:
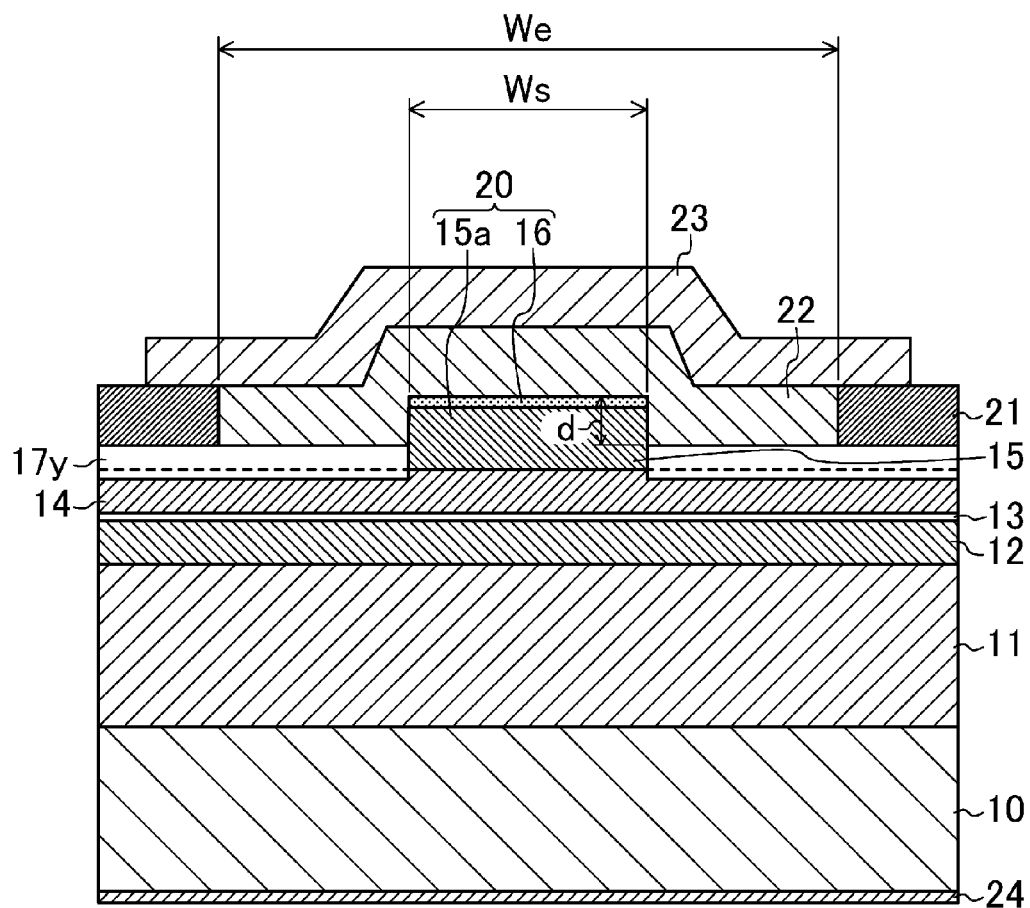
FIG. 12 is a cross-sectional view illustrating the structure of a semiconductor light-emitting device according to a third embodiment.

A semiconductor light-emitting device according to a third embodiment will be described below with reference to FIGS. 12, 13A-13E, and 14A-14D. FIG. 12 is a cross-sectional view illustrating the structure of the semiconductor light-emitting device according to this embodiment. FIGS. 13A-14D are cross-sectional views illustrating a method of manufacturing the semiconductor light-emitting device according to this embodiment. In FIGS. 12 and 13A-14D, the same reference characters as those shown in the first embodiment, i.e., FIGS. 1-4 and 5A-6D are used to represent equivalent elements. Thus, repetitive explanation of the first embodiment will be omitted in this embodiment.

As shown in FIG. 12, a high resistive portion 17y is formed in portions of a p-type guide layer 14 and a p-type cladding layer 15 located at each side of a mesa structure 20. The high resistive portion 17y is an ion-implanted portion. The high resistive portion 17y contains the element derived from the implanted ion. The high resistive portion 17y contains, for example, boron (B), oxygen (O), zinc (Zn), iron (Fe), or silicon (Si).

Figure 13A:
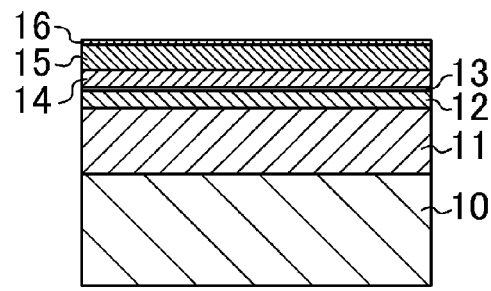
FIGS. 13A-13E are cross-sectional views illustrating a method of manufacturing the semiconductor light-emitting device according to the third embodiment.
Figure 13B:
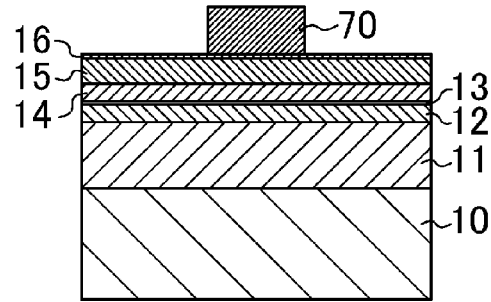
Figure 13C:
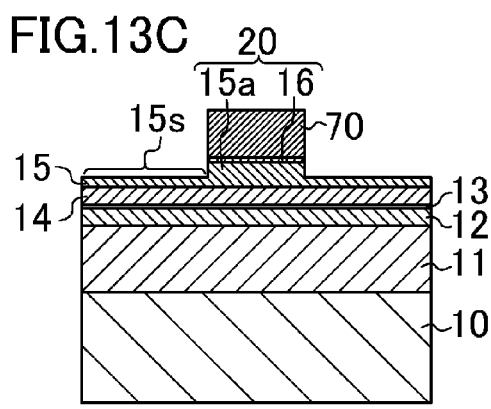
Figure 13D:
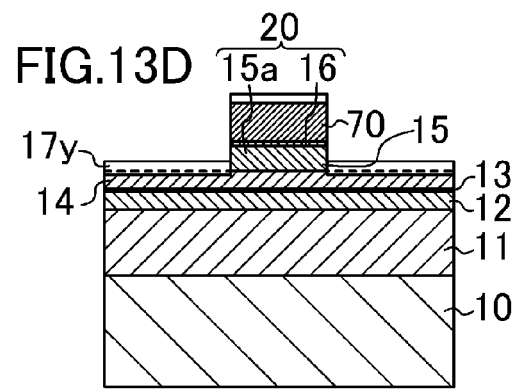
Figure 13E:
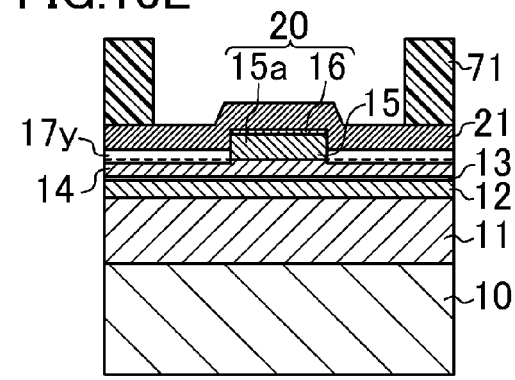
Figure 14A:
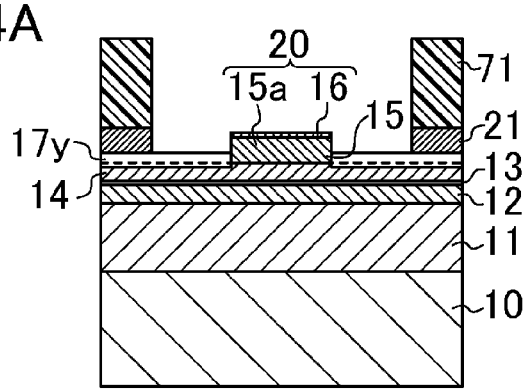
FIGS. 14A-14D are cross-sectional views illustrating the method of manufacturing the semiconductor light-emitting device according to the third embodiment.
Figure 14B:
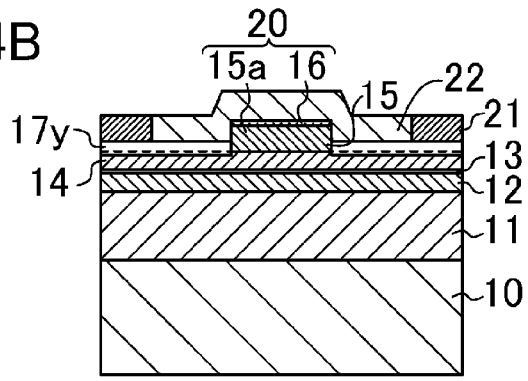
Figure 14C:
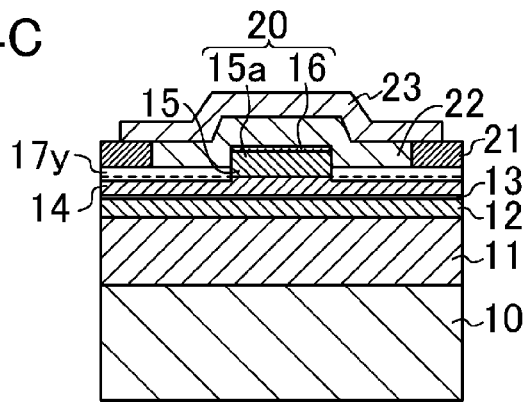
Figure 14D:
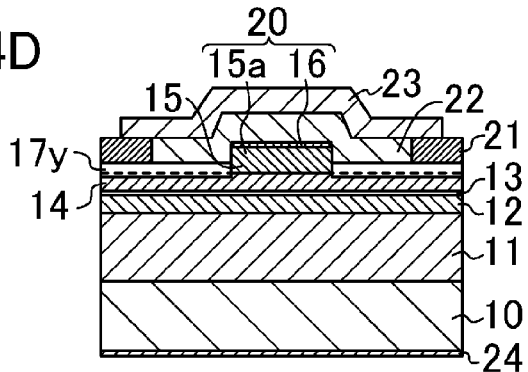

The high resistive portion 17y is formed as follows. After the formation of the mesa structure 20 (see FIG. 13C), as shown in FIG. 13D, ion implantation is performed. Ions are implanted into the portions of the p-type cladding layer 15 and the p-type guide layer 14 at each side of the mesa structure 20 to form the high resistive portion 17y. The ions are preferably boron (B) ions, oxygen (O) ions, zinc (Zn) ions, iron (Fe) ions, or silicon (Si) ions.

In this embodiment, as shown in FIG. 12, the ions implanted into the high resistive portion 17y flow through the interface (see the broken line in FIG. 12) between the p-type cladding layer 15 and the p-type guide layer 14, and reach the p-type guide layer 14.

If the ions reach an active layer 13, the light-emitting efficiency may decrease. Thus, the implantation depth in the high resistive portion 17y needs to be determined to prevent the ions from reaching the active layer 13. Where the p-type cladding layer 15 has a thickness of 0.15 μm (i.e., 150 nm), the implantation depth in the high resistive portion 17y preferably ranges from about 10 nm to about 50 nm. The "implantation depth" is the distance between the upper surface of each side portion of the p-type cladding layer 15 and the lower surface of the high resistive portion 17y.

If an extremely high dose of ions are implanted, light is absorbed. Thus, the implantation dose is preferably $10^{14}$ cm$^2$ or less.

This embodiment provides advantages similar to those of the first embodiment. In addition, the formation of the high resistive portion 17y further increases the resistance at each side portion of the p-type cladding layer 15. This further increases the interface resistance between the side portion of the p-type cladding layer 15 and a cladding electrode 22. Furthermore, the ion implantation increases the resistance at the high resistive portion 17y to $10^6$ Ωcm or more. Leakage currents flowing through the side portions of the p-type cladding layer 15 can be reduced.

While in this embodiment, an example has been described where the ions are implanted after the formation of the mesa structure 20, the present disclosure is not limited thereto. The ions may be implanted, for example, before the formation of the mesa structure or during the formation of the mesa structure. Then, the ions may be implanted into each side portion of the p-type cladding layer to form the high resistive portion.

Fourth Embodiment

Figure 15:
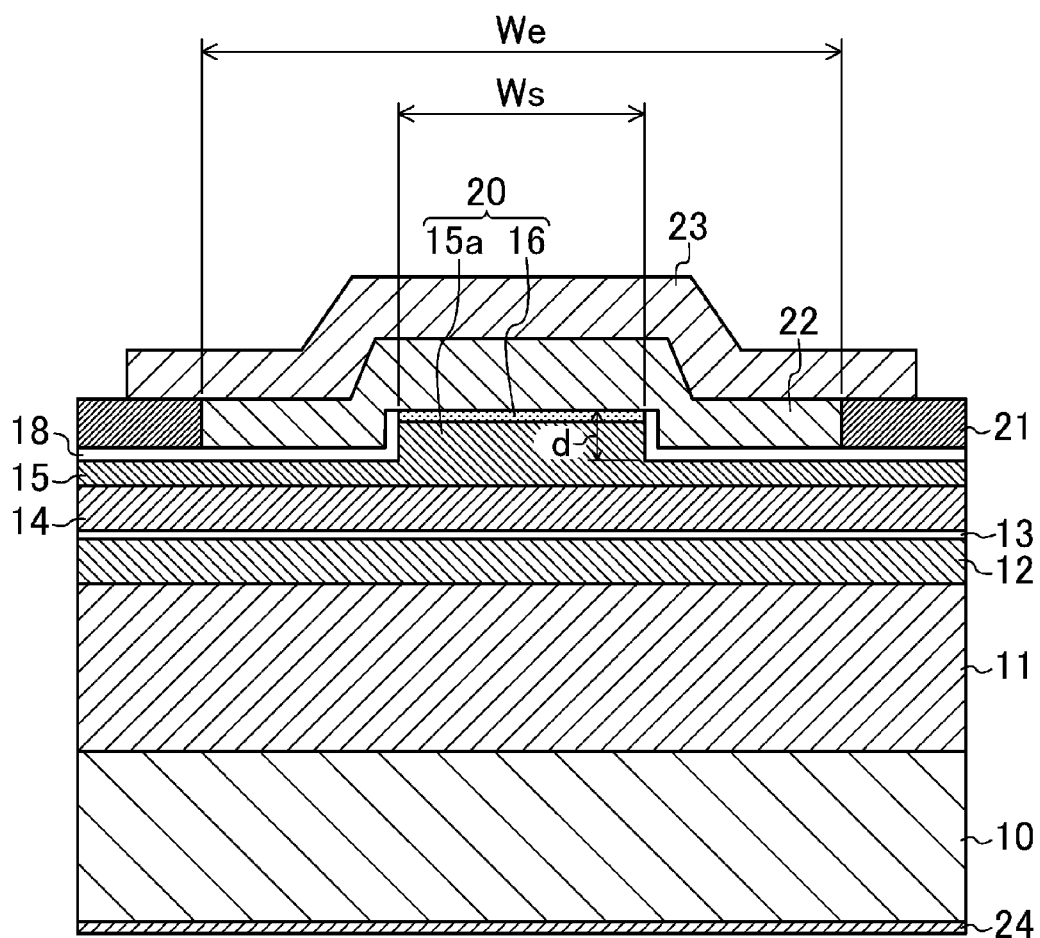
FIG. 15 is a cross-sectional view illustrating the structure of a semiconductor light-emitting device according to a fourth embodiment.

A semiconductor light-emitting device according to a fourth embodiment will be described below with reference to FIGS. 15, 16A-16E, and 17A-17D. FIG. 15 is a cross-sectional view illustrating the structure of the semiconductor light-emitting device according to this embodiment. FIGS. 16A-17D are cross-sectional views illustrating a method of manufacturing the semiconductor light-emitting device according to this embodiment. In FIGS. 15 and 16A-17D, the same reference characters as those shown in the first embodiment, i.e., FIGS. 1-4 and 5A-6D, are used to represent equivalent elements. Thus, repetitive explanation of the first embodiment will be omitted in this embodiment.

As shown in FIG. 15, the semiconductor light-emitting device according to this embodiment further includes a high resistive layer 18. The high resistive layer 18 is formed on the upper portions of the side portions of a p-type cladding layer 15 located at the sides of a mesa structure 20, and on the side surfaces of the mesa structure 20. The high resistive layer 18 is made of, for example, MN.

Figure 16A:
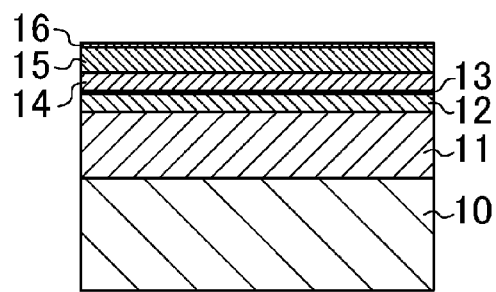
FIGS. 16A-16E are cross-sectional views illustrating a method of manufacturing the semiconductor light-emitting device according to the fourth embodiment.
Figure 16D:
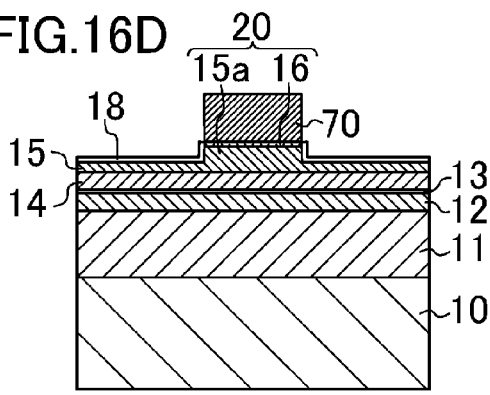
Figure 16B:
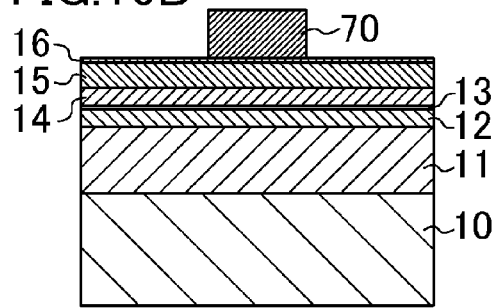
Figure 16E:
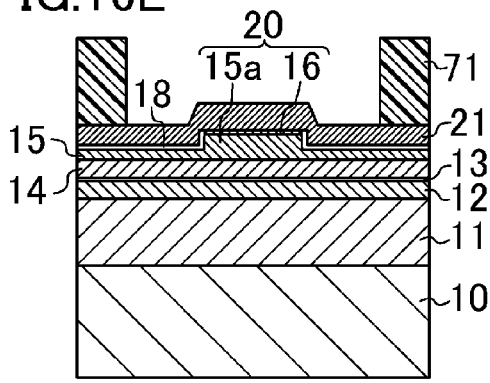
Figure 16C:
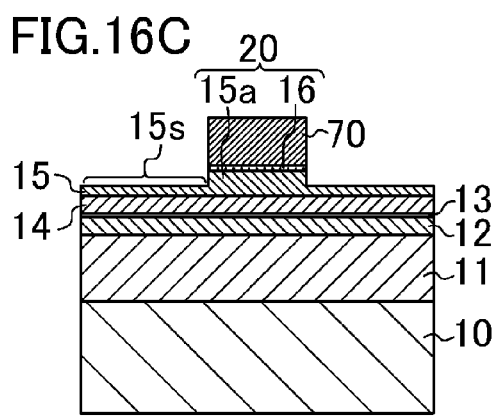
Figure 17A:
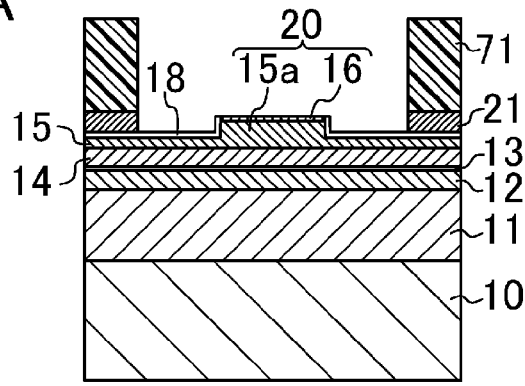
FIGS. 17A-17D are cross-sectional views illustrating the method of manufacturing the semiconductor light-emitting device according to the fourth embodiment.
Figure 17B:
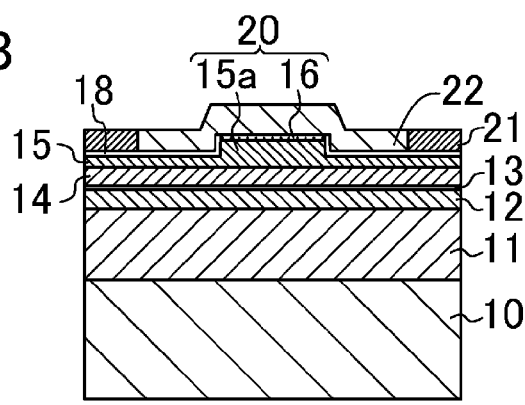
Figure 17C:
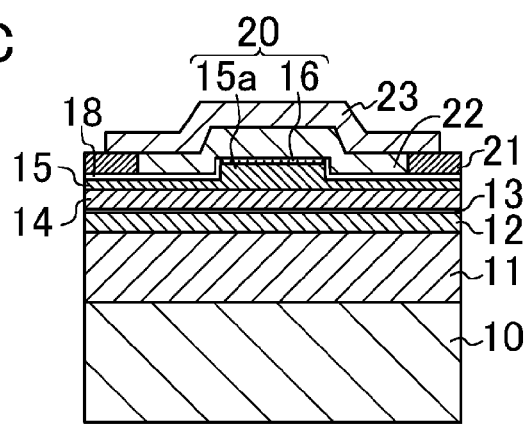
Figure 17D:
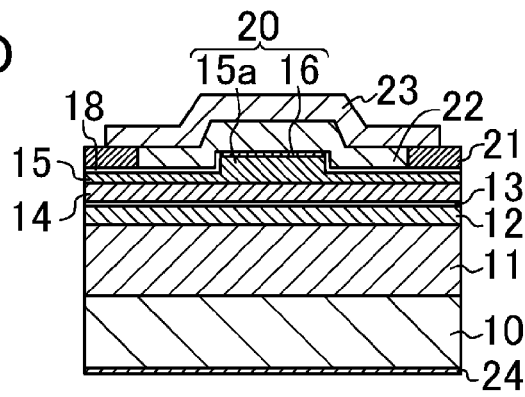

The high resistive layer 18 is formed as follows. After the formation of the mesa structure 20 (see FIG. 16C), as shown in FIG. 16D, the high resistive layer 18 having a thickness ranging from about 1 nm to about 5 nm and made of AlN is grown by MOCVD. At this time, the surfaces of the p-type cladding layer 15 and a contact layer 16, which are made of nitride semiconductor, have different wetting characteristics from the surface of a mask film 70 made of SiO$_2$. Thus, the high resistive layer 18 made of AlN is grown only on the surfaces of the p-type cladding layer 15 and the contact layer 16. On the other hand, the layer made of AlN is hardly grown on the surface of the mask film 70. Therefore, the high resistive layer 18 is formed on the upper surfaces of the side portions of the p-type cladding layer 15, and on the side surfaces of the mesa structure 20. Since the layer made of AlN is hardly grown on the surface of the mask film 70, the mask film 70 can be removed by hydrofluoric acid treatment, similar to the first embodiment.

This embodiment provides advantages similar to those of the first embodiment. In addition, the high resistive layer 18 may be formed between the upper surfaces of the side portions of the p-type cladding layer 15 and a cladding electrode 22, and between each side surface of the mesa structure 20 and the cladding electrode 22.

Fifth Embodiment

Figure 18:
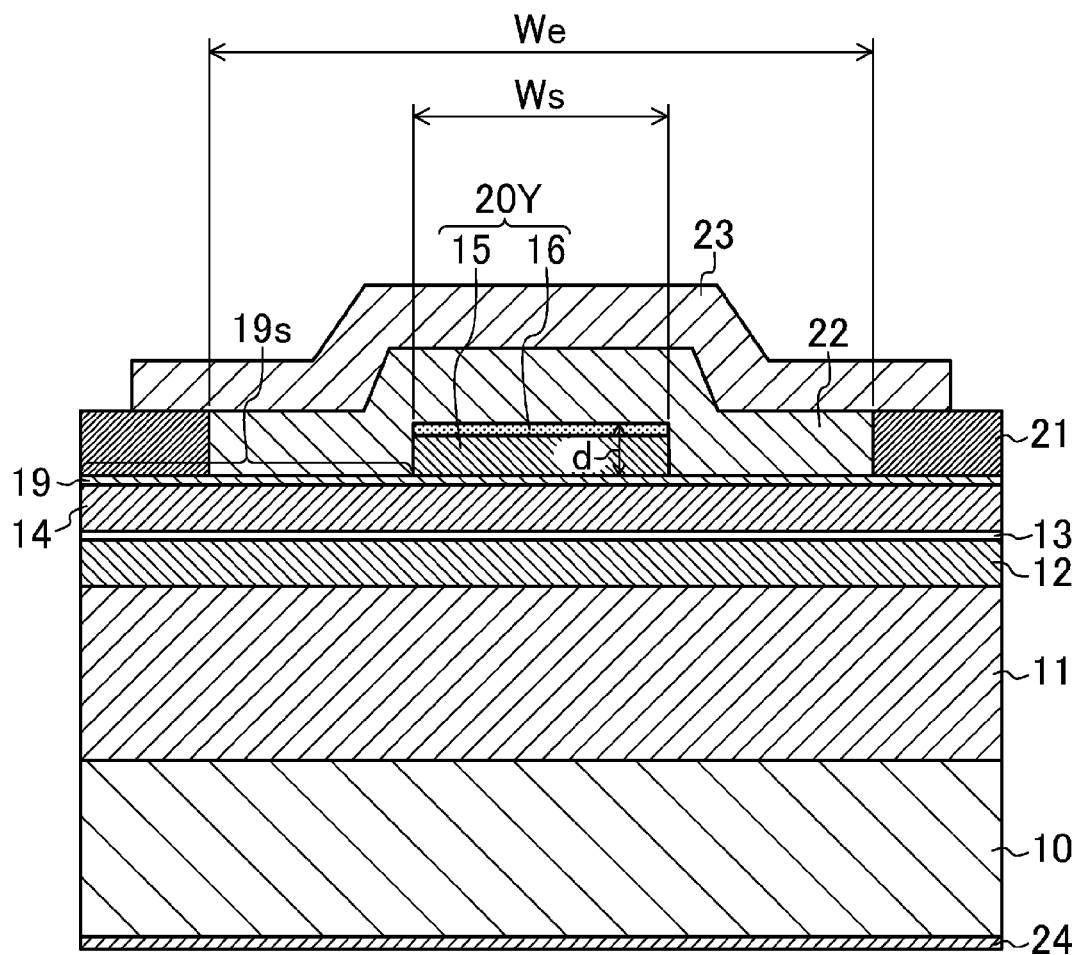
FIG. 18 is a cross-sectional view illustrating the structure of a semiconductor light-emitting device according to a fifth embodiment.

A semiconductor light-emitting device according to a fifth embodiment will be described below with reference to FIGS. 18, 19A-19E, and 20A-20D. FIG. 18 is a cross-sectional view illustrating the structure of the semiconductor light-emitting device according to this embodiment. FIGS. 19A-20D are cross-sectional views illustrating a method of manufacturing the semiconductor light-emitting device according to this embodiment. In FIGS. 18 and 19A-20D, the same reference characters as those shown in the first embodiment, i.e., FIGS. 1-4 and 5A-6D, are used to represent equivalent elements. Thus, repetitive explanation of the first embodiment will be omitted in this embodiment.

As shown in FIG. 18, the semiconductor light-emitting device according to this embodiment further includes an Al-containing layer 19, which contains aluminum (Al). The Al-containing layer 19 is formed between a p-type guide layer 14 and a p-type cladding layer 15, between the p-type guide layer 14 and a cladding electrode 22, and between the p-type guide layer 14 and an insulating film 21. The Al-containing layer 19 is made of, for example, AlGaN with an Al composition ratio of 30%. The Al-containing layer 19 functions as an etching stop layer in the formation of a mesa structure 20.

A mesa structure 20Y includes a p-type cladding layer 15 and a contact layer 16.

Figure 19A:
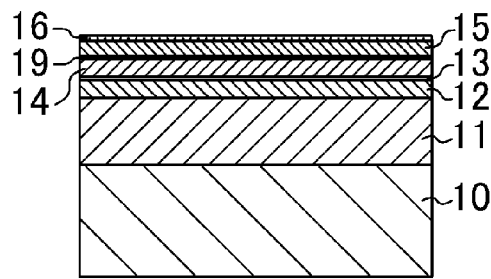
FIGS. 19A-19E are cross-sectional views illustrating a method of manufacturing the semiconductor light-emitting device according to the fifth embodiment.
Figure 19D:
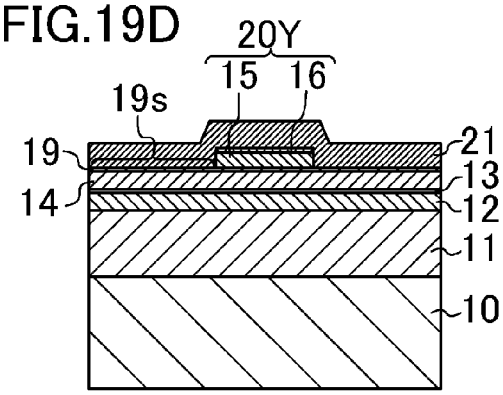
Figure 19B:
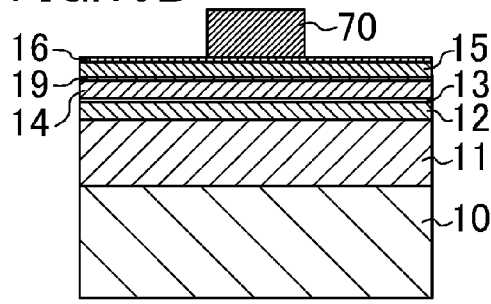
Figure 19E:
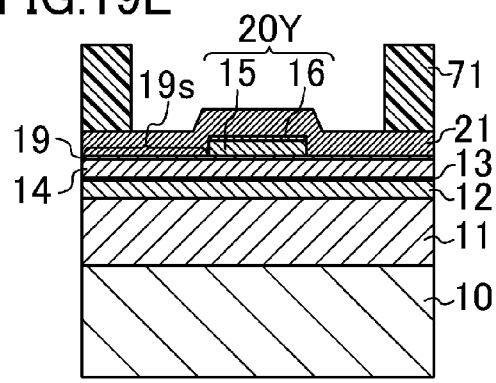
Figure 19C:
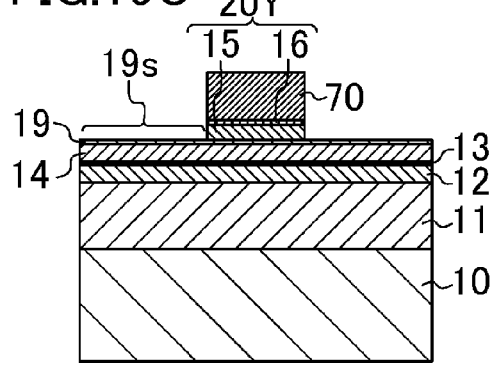
Figure 20A:
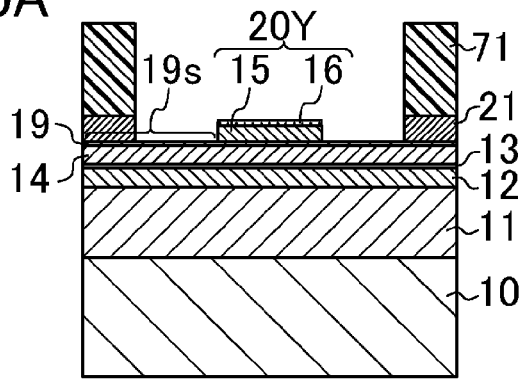
FIGS. 20A-20D are cross-sectional views illustrating the method of manufacturing the semiconductor light-emitting device according to the fifth embodiment.
Figure 20B:
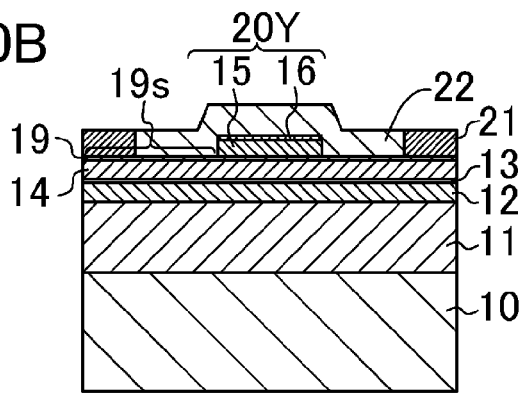
Figure 20C:
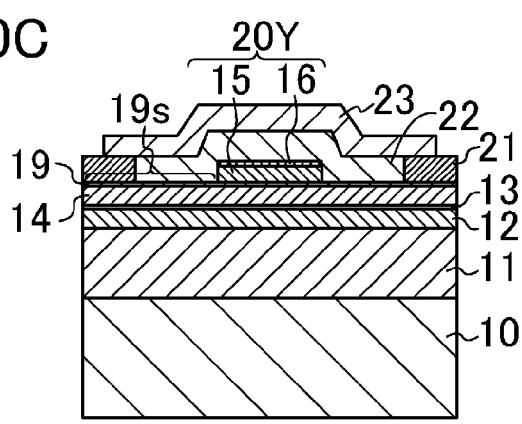
Figure 20D:
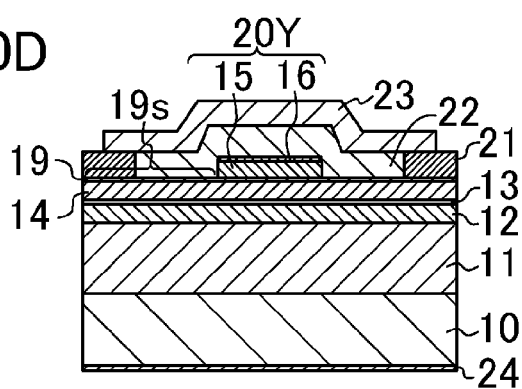

The Al-containing layer 19 is formed as follows. As shown in FIG. 19A, the Al-containing layer 19 having a thickness of about 10 nm, and made of AlGaN with an Al composition ratio of 30% is formed by MOCVD after the formation of the p-type guide layer 14 and before the formation of the p-type cladding layer 15. Then, as shown in FIG. 19C, ICP dry etching using chlorine-based gas is performed. This forms the mesa structure 20Y including the p-type cladding layer 15 and the contact layer 16, and exposes the Al-containing layer 19.

At this time, with use of the difference between the Al composition ratio (30%) of the Al-containing layer 19, and the Al composition ratio (0%) of the GaN layers of the p-type cladding layer 15, which is formed by repeatedly stacking the pairs of the p-type Al$_{0.10}$Ga$_{0.90}$N layer and the GaN layer, the selection ratio of the p-type cladding layer 15 and the Al-containing layer 19 is increased. The Al-containing layer 19 (i.e., the etching stop layer) stops etching.

At this time, the upper surface of the side portion of the Al-containing layer 19 located at each side of the mesa structure 20Y is exposed to chlorine-based plasma to be a high-resistive surface 19s.

In ICP dry etching, not only the chlorine-based gas, but also oxygen ($O_2$) gas is used, thereby greatly changing the etching rate of the p-type cladding layer 15 and the Al-containing layer 19. In particular, where the Al-containing layer 19 has a high Al composition ratio (specifically, for example, 10% or more), the etching rate of the Al-containing layer 19 can be almost zero.

This embodiment provides advantages similar to those of the first embodiment. In addition, the Al-containing layer 19 whose side portion has the upper surface being the high-resistive surface 19s can be formed between the cladding electrode 22 and the portion of the p-type guide layer 14 located at each side of the mesa structure 20Y. Furthermore, the Al-containing layer 19 stops the etching. Thus, the thickness of the mesa structure 20Y is the sum of the thicknesses of the p-type cladding layer 15 and the contact layer 16. The distance between the bottom of the mesa structure 20Y and the upper surface of the active layer 13 is the sum of the thicknesses of the Al-containing layer 19 and the p-type guide layer 14. As a result, a highly reproducible semiconductor light-emitting device can be fabricated, thereby increasing the yields of the semiconductor light-emitting device.

Sixth Embodiment

Figure 21:
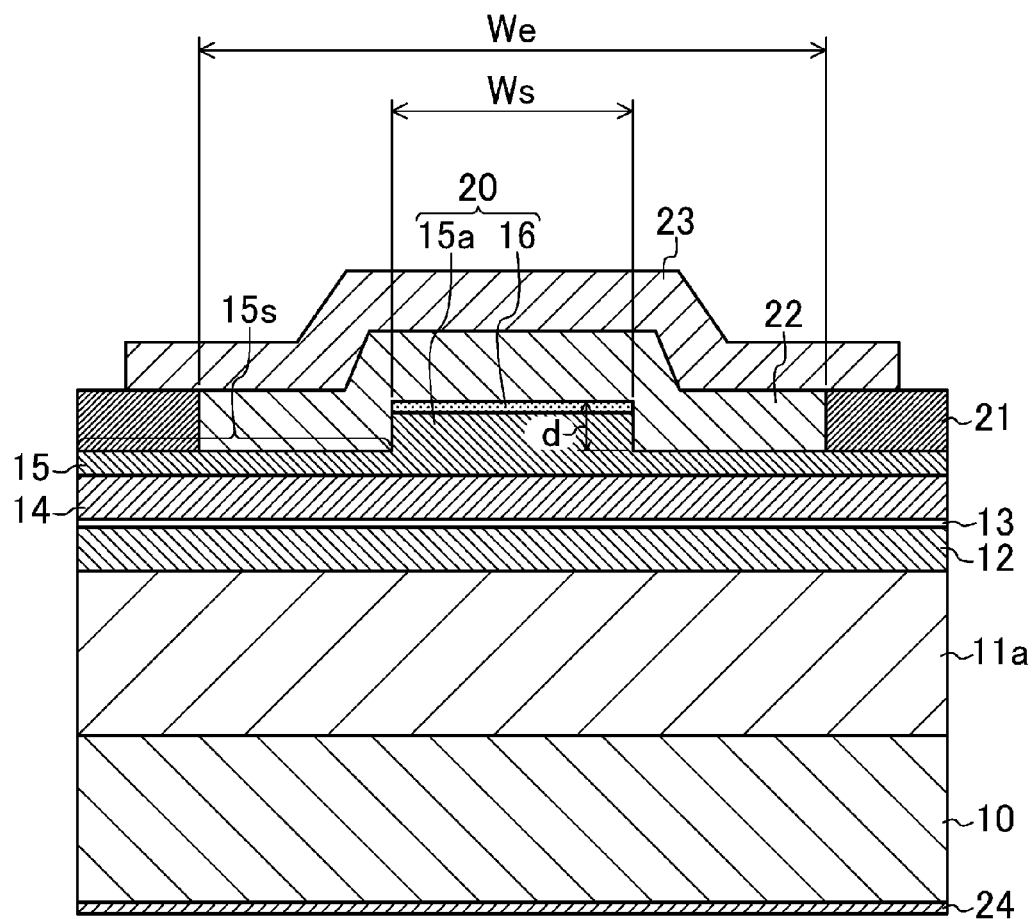
FIG. 21 is a cross-sectional view illustrating the structure of a semiconductor light-emitting device according to a sixth embodiment.
Figure 22:
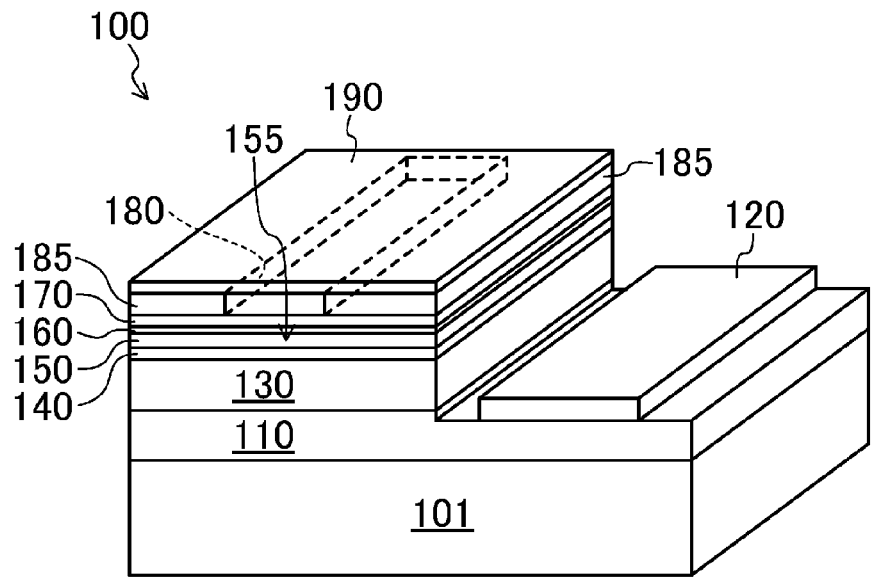
FIG. 22 is a perspective view illustrating the structure of a conventional semiconductor light-emitting device.

A semiconductor light-emitting device according to a sixth embodiment will be described below with reference to FIG. 21. FIG. 21 is a cross-sectional view illustrating the structure of the semiconductor light-emitting device according to this embodiment. In FIG. 21, the same reference characters as those shown in the first embodiment, i.e., FIGS. 1-4 and 5A-6D, are used to represent equivalent elements. Thus, repetitive explanation of the first embodiment will be omitted in this embodiment.

In this embodiment, an n-type cladding layer 11a is used instead of the n-type cladding layer 11 of the first embodiment, which is made of n-type $Al_{0.05}Ga_{0.95}N$. The n-type cladding layer 11a is a superlattice layer including an $Al_{1-x}In_xN$ layer, where $0 \leq x \leq 1$, or an $Al_{1-x}In_xN$ layer and a GaN layer.

In this embodiment, similar to the first embodiment, the cladding electrode 22 made of ITO functions as the cladding layer. ITO has a refractive index of about 2.0, which is extremely smaller than the nitride semiconductor materials of the layers forming the semiconductor multilayer. Thus, the layers located in higher positions than the active layer 13 have extremely high optical confinement.

Where the n-type cladding layer 11 made of $Al_{0.05}Ga_{0.95}Na$ with a refractive index of 2.4 is used as an n-type cladding layer located in a lower position than the active layer 13 as in the first embodiment, there is a small difference in the refractive index between the n-type cladding layer 11 and an n-type guide layer 12 made of GaN with a refractive index of 2.5. Thus, the optical confinement of the layers located in lower positions than the active layer 13 is not so high. Since the optical confinement in the vertical direction is unbalanced between the higher and lower layers than the active layer 13, light is not confined and leaks into a substrate 10, thereby reducing the optical confinement coefficient.

Thus, in this embodiment, a superlattice layer including, for example, a GaN layer and an $Al_{0.82}In_{0.18}N$ layer lattice-matched to the GaN layer or an $Al_{0.82}In_{0.18}N$ layer lattice-matched to the GaN layer is used as the n-type cladding layer 11a located in a lower position than the active layer 13.

This structure reduces the refractive index of the layers lower than the active layer 13 to about 2.0-2.2 without causing distortion, thereby increasing the refractive index difference between the n-type cladding layer 11a and the n-type guide layer 12. This increases the optical confinement in the layers lower than the active layer 13. That is, the unbalance of the vertical optical confinement between the higher and lower layers than the active layer 13 is reduced, thereby increasing the optical confinement coefficient.

This embodiment provides advantages similar to those of the first embodiment. In addition, the optical confinement coefficient increases, thereby providing a more highly efficient semiconductor light-emitting device.

In this embodiment, an example has been described where the semiconductor light-emitting device is a semiconductor laser diode. However, the semiconductor light-emitting device may be an SLD, which provides advantages similar to those of this embodiment. An SLD is suitable for the structure according to this embodiment, since the characteristics improve with an increase in the optical confinement.

In the first embodiment, the variation, and the second to sixth embodiments, an example has been described where the semiconductor light-emitting device is a blue (B) semiconductor laser using nitride semiconductor $Al_xGa_yIn_{1-x-y}N$, where $0 \leq x$, $y \leq 1$, and $0 \leq x+y \leq 1$. However, the present disclosure is not limited thereto.

By changing the composition ratio of nitride semiconductor $Al_xGa_yIn_{1-x-y}N$, a semiconductor light-emitting device of violet (V, with a wavelength of about 380 nm) to green (G, with a wavelength of about 550 nm) may be provided.

By changing the composition of nitride semiconductor $Al_xGa_yIn_{1-x-y}N$, specifically, to nitride semiconductor $Al_xGa_yIn_{1-x-y}As_zP_{1-z}$, where $0 \leq x$, $y$, $z \leq 1$, $0 \leq x+y \leq 1$), a semiconductor light-emitting device of red (R, with a wavelength of about 600 nm) to infrared red (IR, with a wavelength of about 750 nm) can be provided.

An red (R), green (G), or blue (B) semiconductor light-emitting device may be used as a light source of an image display apparatus such as a display and a projector, or a light source of a liquid crystal display apparatus.

The present disclosure provides a highly efficient semiconductor light-emitting device reducing an increase in the threshold current, and is useful for a semiconductor light-emitting device using a transparent electrode material. The semiconductor light-emitting device according to the present disclosure is useful as a light source of an image display apparatus, a crystal display apparatus, and laser equipment.

What is claimed is:

1. A semiconductor light-emitting device comprising:
a substrate;
a semiconductor layer formed on the substrate;
an active layer formed on the semiconductor layer;
a guide layer formed on the active layer;
a contact layer formed on the guide layer, and made of semiconductor;
a cladding electrode formed on the contact layer, and made of conductive metal oxide;
a pad electrode electrically coupled to the cladding electrode; and
a cladding layer formed between the guide layer and the contact layer,
wherein the semiconductor light-emitting device includes a striped mesa structure including the contact layer, the pad electrode has a greater width than the cladding electrode, the cladding electrode has a greater width than the mesa structure, the cladding electrode covers an upper surface and side surfaces of the mesa structure, and is electrically coupled to the contact layer, the cladding layer has a raised portion, the mesa structure includes the raised portion of the cladding layer, and the contact layer formed on the raised portion of the cladding layer, the cladding electrode covers upper surfaces of side portions of the cladding layer located at sides of the mesa structure, and the side portions of the cladding layer are in Schottky contact with the cladding electrode.

2. A semiconductor light-emitting device comprising:
a substrate;
a semiconductor layer formed on the substrate;
an active layer formed on the semiconductor layer;
a guide layer formed on the active layer;
a contact layer formed on the guide layer, and made of semiconductor;
a cladding electrode formed on the contact layer, and made of conductive metal oxide;
a pad electrode electrically coupled to the cladding electrode; and
a cladding layer formed between the guide layer and the contact layer,
wherein the semiconductor light-emitting device includes a striped mesa structure including the contact layer,
the pad electrode has a greater width than the cladding electrode,
the cladding electrode has a greater width than the mesa structure,
the cladding electrode covers an upper surface and side surfaces of the mesa structure, and is electrically coupled to the contact layer,
the cladding layer has a raised portion,
the mesa structure includes the raised portion of the cladding layer, and the contact layer formed on the raised portion of the cladding layer, and
a surface layer having a conductivity type opposite to that of the cladding layer is formed in side portions of the cladding layer located at sides of the mesa structure.

3. A semiconductor light-emitting device comprising:
a substrate;
a semiconductor layer formed on the substrate;
an active layer formed on the semiconductor layer;
a guide layer formed on the active layer;
a contact layer formed on the guide layer, and made of semiconductor;
a cladding electrode formed on the contact layer, and made of conductive metal oxide;
a pad electrode electrically coupled to the cladding electrode; and
a cladding layer formed between the guide layer and the contact layer,
wherein the semiconductor light-emitting device includes a striped mesa structure including the contact layer,
the pad electrode has a greater width than the cladding electrode,
the cladding electrode has a greater width than the mesa structure,
the cladding electrode covers an upper surface and side surfaces of the mesa structure, and is electrically coupled to the contact layer, the cladding layer has a raised portion,
the mesa structure includes the raised portion of the cladding layer, and the contact layer formed on the raised portion of the cladding layer,
a high resistive portion is formed in a side portion of the cladding layer located at each side of the mesa structure,
the high resistive portion is a modified portion formed by modifying an upper portion of the side portion of the cladding layer by plasma treatment using plasma,
the plasma is fluorine plasma or oxygen plasma, and
the high resistive portion contains fluorine or oxygen.

4. A semiconductor light-emitting device comprising:
a substrate;
a semiconductor layer formed on the substrate;
an active layer formed on the semiconductor layer;
a guide layer formed on the active layer;
a contact layer formed on the guide layer, and made of semiconductor;
a cladding electrode formed on the contact layer, and made of conductive metal oxide;
a pad electrode electrically coupled to the cladding electrode; and
a cladding layer formed between the guide layer and the contact layer,
wherein the semiconductor light-emitting device includes a striped mesa structure including the contact layer,
the pad electrode has a greater width than the cladding electrode,
the cladding electrode has a greater width than the mesa structure,
the cladding electrode covers an upper surface and side surfaces of the mesa structure, and is electrically coupled to the contact layer,
the cladding layer has a raised portion,
the mesa structure includes the raised portion of the cladding layer, and the contact layer formed on the raised portion of the cladding layer,
a high resistive portion is formed in a side portion of the cladding layer located at each side of the mesa structure,
the high resistive portion is an ion-implanted portion formed by implanting ions,
the ions are boron ions, oxygen ions, zinc ions, iron ions, or silicon ions, and
the high resistive portion contains boron, oxygen, zinc, iron, or silicon.

5. The semiconductor light emitting device of claim 1, wherein
a distance between the upper surface and a lower surface of the mesa structure ranges from 10 nm to 200 nm, both inclusive.

6. The semiconductor light-emitting device of claim 1, further comprising:
an Al-containing layer formed between the guide layer and the contact layer, and containing aluminum,
wherein the cladding layer is formed between the Al-containing layer and the contact layer, and
the Al-containing layer has a higher Al composition ratio than the cladding layer.

7. The semiconductor light-emitting device of claim 1, wherein
the guide layer has a raised portion, and
the mesa structure includes the raised portion of the guide layer.

8. The semiconductor light-emitting device of claim 1, wherein
the semiconductor layer includes an AlInN layer.

9. The semiconductor light emitting device of claim 2, wherein
a distance between the upper surface and a lower surface of the mesa structure ranges from 10 nm to 200 nm, both inclusive.

10. The semiconductor light-emitting device of claim 2, further comprising:
an Al-containing layer formed between the guide layer and the contact layer, and containing aluminum,
wherein the cladding layer is formed between the Al-containing layer and the contact layer, and
the Al-containing layer has a higher Al composition ratio than the cladding layer.

11. The semiconductor light-emitting device of claim 2, wherein
the guide layer has a raised portion, and
the mesa structure includes the raised portion of the guide layer.

12. The semiconductor light-emitting device of claim 2, wherein
the semiconductor layer includes an AlInN layer.

13. The semiconductor light emitting device of claim 3, wherein
a distance between the upper surface and a lower surface of the mesa structure ranges from 10 nm to 200 nm, both inclusive.

14. The semiconductor light-emitting device of claim 3, further comprising:
an Al-containing layer formed between the guide layer and the contact layer, and containing aluminum,
wherein the cladding layer is formed between the Al-containing layer and the contact layer, and
the Al-containing layer has a higher Al composition ratio than the cladding layer.

15. The semiconductor light-emitting device of claim 3, wherein
the guide layer has a raised portion, and
the mesa structure includes the raised portion of the guide layer.

16. The semiconductor light-emitting device of claim 3, wherein
the semiconductor layer includes an AlInN layer.

17. The semiconductor light emitting device of claim 4, wherein
a distance between the upper surface and a lower surface of the mesa structure ranges from 10 nm to 200 nm, both inclusive.

18. The semiconductor light-emitting device of claim 4, further comprising:
an Al-containing layer formed between the guide layer and the contact layer, and containing aluminum,
wherein the cladding layer is formed between the Al-containing layer and the contact layer, and
the Al-containing layer has a higher Al composition ratio than the cladding layer.

19. The semiconductor light-emitting device of claim 4, wherein
the guide layer has a raised portion, and
the mesa structure includes the raised portion of the guide layer.

20. The semiconductor light-emitting device of claim 4, wherein
the semiconductor layer includes an AlInN layer.

* * * * *